United States Patent
Coakley et al.

(10) Patent No.: US 10,542,616 B2
(45) Date of Patent: *Jan. 21, 2020

(54) SYSTEMS AND METHODS FOR COMBINED THERMAL AND ELECTRICAL ENERGY TRANSFER

(71) Applicant: CelLink Corporation, San Carlos, CA (US)

(72) Inventors: Kevin Michael Coakley, Belmont, CA (US); Malcolm Brown, Mountain View, CA (US)

(73) Assignee: CELLINK CORPORATION, San Carlos, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/200,227

(22) Filed: Nov. 26, 2018

(65) Prior Publication Data

US 2019/0098745 A1   Mar. 28, 2019

Related U.S. Application Data

(63) Continuation of application No. 15/787,676, filed on Oct. 18, 2017, now Pat. No. 10,172,229, which is a
(Continued)

(51) Int. Cl.
*H01L 33/64* (2010.01)
*H05K 1/02* (2006.01)
*H05K 1/18* (2006.01)

(52) U.S. Cl.
CPC ......... *H05K 1/0209* (2013.01); *H01L 33/647* (2013.01); *H05K 1/18* (2013.01); *H05K 2201/10106* (2013.01)

(58) Field of Classification Search
CPC ...... H01L 33/647; H05K 1/0209; H05K 1/18; H05K 2201/10106
See application file for complete search history.

(56) References Cited

U.S. PATENT DOCUMENTS

| 3,864,169 A | 2/1975 | Cestaro et al. |
| 3,870,212 A | 3/1975 | Polk |

(Continued)

FOREIGN PATENT DOCUMENTS

| CN | 101136396 A | 3/2008 |
| CN | 101199242 A | 6/2008 |

(Continued)

OTHER PUBLICATIONS

"U.S. Appl. No. 15/787,676, Examiner Interview Summary dated Sep. 12, 2018", 1 page.

(Continued)

*Primary Examiner* — Mohammed Shamsuzzaman
(74) *Attorney, Agent, or Firm* — Kwan & Olynick LLP

(57) ABSTRACT

Provided are interconnect circuits for combined electrical and thermal energy transfer to devices connected to these circuits. Also provided are methods of fabricating such interconnect circuits. An interconnect circuit may include an electro-thermal conductor and at least one insulator providing support to different portions of the conductor with respect to each other. The insulator may include one or more openings for electrical connections and/or heat exchange with the electro-thermal conductor. The portions of the conductor may be electrically isolated from each other in the final circuit. Initially, these portions may be formed from the same conductive sheet, such as a metal foil having a thickness of at least about 50 micrometers. This thickness ensures sufficient thermal transfer in addition to providing excellent electrical conductance. In some embodiments, the conductor may include a surface coating to protect its base material from oxidation, enhancing electrical connections, and/or other purposes.

20 Claims, 22 Drawing Sheets

Related U.S. Application Data continuation of application No. 15/259,518, filed on Sep. 8, 2016, now Pat. No. 9,832,857, which is a continuation of application No. 15/015,088, filed on Feb. 3, 2016, now Pat. No. 9,466,777.

(60) Provisional application No. 62/277,093, filed on Jan. 11, 2016, provisional application No. 62/111,333, filed on Feb. 3, 2015.

(56) References Cited

U.S. PATENT DOCUMENTS

| | | | |
|---|---|---|---|
| 4,047,457 A | 9/1977 | Stubbings | |
| 4,147,337 A | 4/1979 | Bolza-Schunemann | |
| 4,908,337 A | 3/1990 | Treffer | |
| 5,158,842 A | 10/1992 | McHenry | |
| 5,354,629 A | 10/1994 | Kuroda et al. | |
| 5,622,652 A | 4/1997 | Kucherovsky et al. | |
| 5,645,932 A | 7/1997 | Uchibori | |
| 5,656,081 A | 8/1997 | Isen | |
| 5,708,297 A * | 1/1998 | Clayton | H01L 23/13 257/712 |
| 5,796,588 A | 8/1998 | Machida | |
| 5,866,942 A * | 2/1999 | Suzuki | H01L 23/49816 257/678 |
| 6,010,771 A | 1/2000 | Isen et al. | |
| 6,042,966 A | 3/2000 | Cheu | |
| 6,175,084 B1 | 1/2001 | Saitoh et al. | |
| 6,214,444 B1 | 4/2001 | Uchibori | |
| 6,284,405 B2 | 9/2001 | Kaido et al. | |
| 6,331,678 B1 * | 12/2001 | Wang | H05K 1/0271 174/253 |
| 6,370,019 B1 * | 4/2002 | Matthies | G02F 1/13336 257/E25.032 |
| 6,383,616 B1 | 5/2002 | Uchibori | |
| 6,632,538 B1 | 10/2003 | Yamazaki | |
| 6,911,724 B1 | 6/2005 | Satardja | |
| 6,972,544 B2 | 12/2005 | Seman et al. | |
| 7,686,853 B2 | 3/2010 | Seman, Jr. et al. | |
| 8,143,631 B2 | 3/2012 | Crandell et al. | |
| 8,236,443 B2 | 8/2012 | Snyder et al. | |
| 8,404,376 B2 | 3/2013 | Snyder et al. | |
| 8,414,308 B1 | 4/2013 | Meyers | |
| 8,426,063 B2 | 4/2013 | Lin | |
| 8,475,954 B2 | 7/2013 | Ijaz et al. | |
| 8,497,037 B2 | 7/2013 | Hosoe et al. | |
| 8,635,761 B2 | 1/2014 | Wu | |
| 8,913,368 B2 | 12/2014 | Hosoe et al. | |
| 8,920,955 B1 | 12/2014 | Chuang et al. | |
| 8,975,510 B2 | 3/2015 | Coakley | |
| 9,147,875 B1 | 9/2015 | Coakley | |
| 9,343,595 B2 * | 5/2016 | Fu | H01L 31/02243 |
| 9,466,777 B2 | 10/2016 | Coakley et al. | |
| 9,545,010 B2 | 1/2017 | Coakley et al. | |
| 9,832,857 B2 | 11/2017 | Coakley et al. | |
| 9,844,148 B2 | 12/2017 | Coakley et al. | |
| 10,172,229 B2 | 1/2019 | Coakley et al. | |
| 2001/0012588 A1 | 8/2001 | Kaido et al. | |
| 2002/0025416 A1 * | 2/2002 | Uchibori | B32B 15/04 428/209 |
| 2003/0143958 A1 * | 7/2003 | Elias | H01L 23/3733 455/73 |
| 2004/0261700 A1 * | 12/2004 | Edwards | B25B 11/005 118/679 |
| 2006/0213548 A1 | 9/2006 | Bachrach et al. | |
| 2008/0196930 A1 | 8/2008 | Tuominen et al. | |
| 2008/0216887 A1 | 9/2008 | Hacke et al. | |
| 2009/0022885 A1 | 1/2009 | Matsumoto et al. | |
| 2009/0045964 A1 | 2/2009 | Takeda et al. | |
| 2009/0111015 A1 | 4/2009 | Wood et al. | |
| 2009/0139781 A1 | 6/2009 | Straubel | |
| 2009/0233237 A1 | 9/2009 | Yoshiki et al. | |
| 2009/0250104 A1 | 10/2009 | Inoue et al. | |
| 2010/0154855 A1 * | 6/2010 | Nemir | H01L 35/30 136/205 |
| 2011/0316038 A1 | 12/2011 | Hirotsuru et al. | |
| 2012/0088140 A1 | 4/2012 | Kardasz et al. | |
| 2012/0183823 A1 | 7/2012 | Von Borck et al. | |
| 2012/0240995 A1 * | 9/2012 | Coakley | H01L 31/0201 136/256 |
| 2012/0288757 A1 | 11/2012 | Hosoe et al. | |
| 2013/0004844 A1 | 1/2013 | Hosoe et al. | |
| 2013/0004856 A1 | 1/2013 | Hosoe et al. | |
| 2013/0089769 A1 | 4/2013 | Proctor et al. | |
| 2013/0098424 A1 | 4/2013 | Tsuda et al. | |
| 2013/0112233 A1 | 5/2013 | Coakley | |
| 2013/0228890 A1 * | 9/2013 | Eisele | G01K 7/16 257/467 |
| 2013/0291375 A1 | 11/2013 | Virtanen et al. | |
| 2013/0307133 A1 | 11/2013 | Toba | |
| 2014/0061877 A1 | 3/2014 | Lin et al. | |
| 2014/0212695 A1 | 7/2014 | Lane et al. | |
| 2014/0234683 A1 | 8/2014 | Sweney | |
| 2015/0050525 A1 | 2/2015 | Ahn | |
| 2016/0073506 A1 | 3/2016 | Coakley et al. | |
| 2016/0225969 A1 | 8/2016 | Coakley et al. | |
| 2017/0034902 A1 | 2/2017 | Coakley et al. | |
| 2017/0077487 A1 | 3/2017 | Coakley et al. | |
| 2017/0094802 A1 | 3/2017 | Coakley et al. | |
| 2018/0063943 A1 | 3/2018 | Coakley et al. | |

FOREIGN PATENT DOCUMENTS

| | | |
|---|---|---|
| CN | 101496151 A | 7/2009 |
| CN | 203631548 U | 6/2014 |
| CN | 103988283 A | 8/2014 |
| CN | 107078263 A | 8/2017 |
| CN | 107408544 A | 11/2017 |
| CN | ZL201580056710.9 | 4/2019 |
| EP | 2461408 A1 | 6/2012 |
| EP | 3192111 | 7/2017 |
| JP | 6326236 | 11/1994 |
| JP | 2007508681 A | 4/2007 |
| KR | 1020110117694 A | 10/2011 |
| KR | 10-1829178 | 2/2018 |
| WO | 2016040040 A1 | 3/2016 |
| WO | 2016126890 A1 | 8/2016 |

OTHER PUBLICATIONS

"U.S. Appl. No. 15/787,676, Notice of Allowance dated Sep. 12, 2018", 12 pages.

"Chinese Application Serial No. 201680019793.9, Office Action dated Nov. 23, 2018", 10 pgs.

"Korean Application Serial No. 10-2017-7024694, Final Office Action dated Nov. 29, 2018", 9 pgs.

"U.S. Appl. No. 14/671,814, Notice of Allowance dated Jun. 1, 2015", 12 pgs.

"U.S. Appl. No. 14/836,946, Notice of Allowance dated Sep. 28, 2016", 10 pages.

"U.S. Appl. No. 15/015,088, Examiner Interview Summary dated Aug. 3, 2016", 1 page.

"U.S. Appl. No. 15/015,088, Notice of Allowance dated Aug. 3, 2016", 14 pages.

"U.S. Appl. No. 15/015,088, Restriction Requirement dated May 31, 2016", 8 pages.

"U.S. Appl. No. 15/259,518, Examiner Interview Summary dated Jul. 18, 2017", 1 page.

"U.S. Appl. No. 15/259,518, Notice of Allowance dated Jul. 18, 2017", 16 pgs.

"U.S. Appl. No. 15/259,518, Restriction Requirement dated Mar. 22, 2017", 8 pages.

"U.S. Appl. No. 15/289,028, Requirement for Restriction dated Sep. 12, 2017", 13 pgs.

"U.S. Appl. No. 15/379,177, Ex Parte Quayle Action mailed Jul. 11, 2017", 5 pgs.

"U.S. Appl. No. 15/379,177, Notice of Allowance dated Sep. 7, 2017", 8 pgs.

(56) References Cited

OTHER PUBLICATIONS

"U.S. Appl. No. 15/787,676, Restriction Requirement dated Jul. 9, 2018", 8 pgs.
"U.S. Appl. No. PCT/US16/16469, Search Report and Written Opinion dated May 17, 2016", 7 pages.
"Chinese Application Serial No. 201580056710.9, Office Action dated Apr. 4, 2018", 6 pgs.
"Chinese Application Serial No. 201680019793.9, Office Action dated May 2, 2018", 20 pgs.
"European Application Serial No. 15840309.7, Search Report dated Oct. 24, 2017", 4 pgs.
"Application Serial No. 17176834.4, Office Action dated Nov. 24, 2017", 9 pgs.
"European Application Serial No. 16747245.5, Search Report dated May 29, 2018", 12 pgs.
"International Application Serial No. PCT/US15/47821, International Preliminary Report on Patentability dated Mar. 23, 2017", 6 pages.
"International Application Serial No. PCT/US16/16469, Int'l Preliminary Report on Patentability dated Aug. 17, 2017", 7 pages.
"Int'l Application Serial No. PCT/US2015/047821, Search Report and Written Opinion dated Oct. 29, 2015", 9 pgs.
"Korean Application Serial No. 10-2017-7009130, Office Action dated Jul. 20, 2017", 13 pgs.
"Korean Application Serial No. 10-2017-7024694, Office Action dated Jun. 10, 2018", 14 pgs.
Coakley, Kevin M. et al., "Interconnect for Battery Pack", PCT/US15/47821, 101.
Coakley, Kevin M. et al., "Interconnect for Battery Pack", U.S. Appl. No. 14/836,946, 98 pgs.
Schubert, Gunter, "Adhesion of Aluminium Foil to Coating—Stick with it", TAPPI 03/G. Schubert, http://www.tappi.org/content/enewsletters/eplace/2004/10-1schub1.pdf, May 14, 2003.
Zhang, Shengde et al., "Mechanical Properties of Copper Thin Films Used in Electronic Devices", Procedia Engineering 10 (2011) 1497-1502 <www.sciencedirect.com>, 2011, 6 pgs.
"Chinese Application Serial No. 201680019793.9, Office Action dated Mar. 5, 2019", 18 pgs.
"European Application Serial No. 16747245.5, Office Action dated Apr. 11, 2019", 11 pgs.
"Korean Application Serial No. 10-2017-7024694, Final Office Action dated Apr. 4, 2019", 3 pgs.

\* cited by examiner

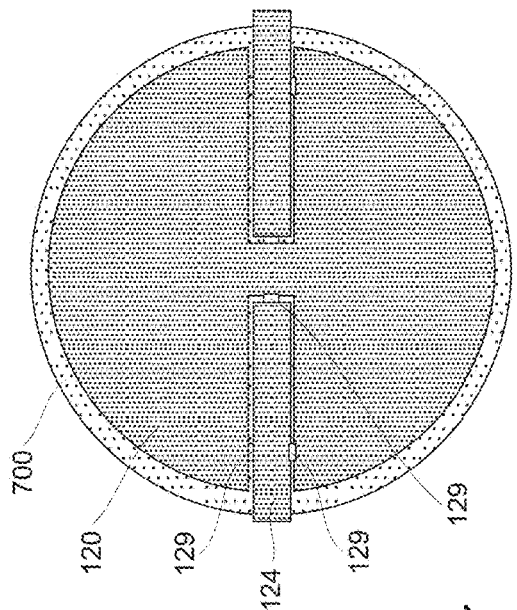
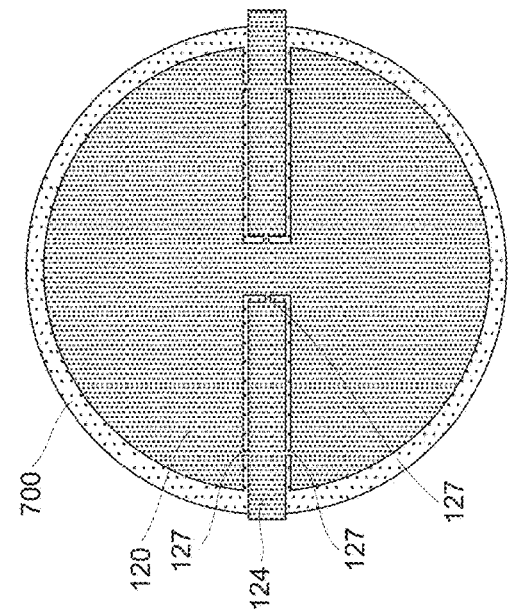
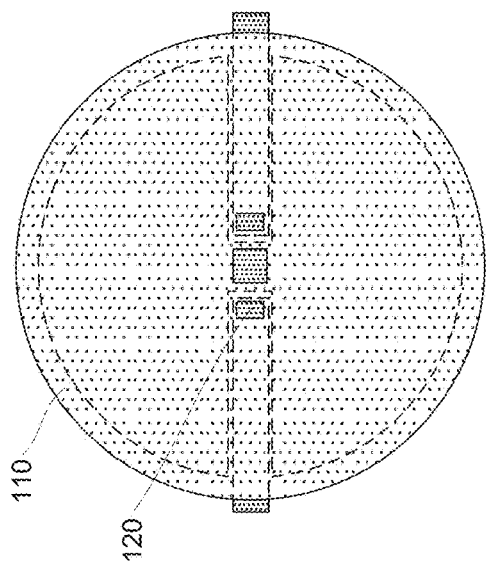

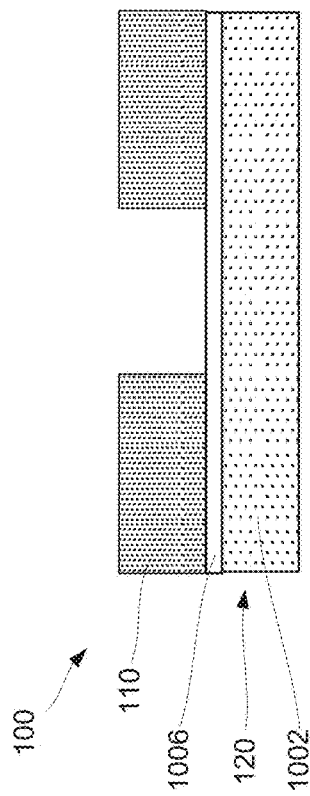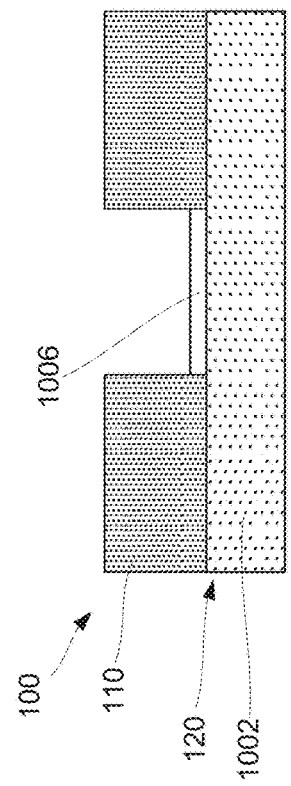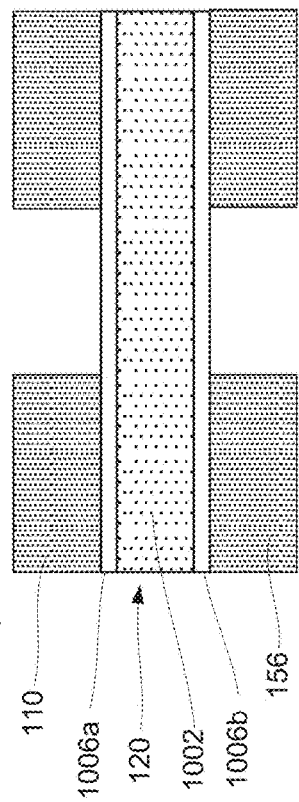

SYSTEMS AND METHODS FOR COMBINED THERMAL AND ELECTRICAL ENERGY TRANSFER

CROSS-REFERENCE TO RELATED APPLICATIONS

This application is a continuation of U.S. application Ser. No. 15/787,676, entitled "SYSTEMS AND METHODS FOR COMBINED THERMAL AND ELECTRICAL ENERGY TRANSFER" filed on 2017 Oct. 18, which is a continuation of U.S. application Ser. No. 15/259,518, entitled "SYSTEMS AND METHODS FOR COMBINED THERMAL AND ELECTRICAL ENERGY TRANSFER" filed on 2016 Sep. 8, issued as U.S. Pat. No. 9,832,857 on 2017 Oct. 28, which is a continuation of U.S. application Ser. No. 15/015,088, entitled "SYSTEMS AND METHODS FOR COMBINED THERMAL AND ELECTRICAL ENERGY TRANSFER" filed on 2016 Feb. 3, issued as U.S. Pat. No. 9,466,777 on 2016 Oct. 11 and which claims the benefit under 35 U.S.C. § 119(e) of U.S. Provisional Patent Application 62/277,093, entitled: "SYSTEMS AND METHODS FOR COMBINED THERMAL AND ELECTRICAL ENERGY TRANSFER" filed on 2016 Jan. 11 and of U.S. Provisional Patent Application 62/111,333, entitled: "Interconnect for BATTERY PACKS" filed on 2015 Feb. 3. All of these patent applications are incorporated herein by reference in their entirety for all purposes.

BACKGROUND

This disclosure relates to interconnect circuits for electrically connecting devices, such as light emitting diodes (LEDs). More specifically, the disclosure relates to interconnect circuits that provide combined thermal and electrical energy transfer within these circuits and provide thermal management to the devices.

During operation of various electrical and electronic devices, these devices may generate (or consume) thermal energy. For example, a portion of electrical energy consumed by a device may be converted into thermal energy during operation of the device. This electrical-to-thermal energy conversion depends on the device efficiency. While generation (or consumption) of thermal energy in closely packed circuits is often not desirable, it is an inherent characteristic of many devices. Some examples of conventional electronic circuits include, but are not limited to, printed circuit boards (PCBs), flexible printed circuits (FPCs) and flexible flat cables (FFCs). Generally, these circuits are designed with a high packing density of devices, which may interfere with thermal management. At the same time, many devices have limited operating temperature ranges, outside of which their performance degrades, either temporarily or permanently. Various heat transfer features, such as heat sinks, heat spreaders, coolers, heat exchangers, heat pipes and fans, may be added to circuits to facilitate their thermal management. However, many of these heat transfer features are difficult to integrate into compact circuits. Furthermore, these heat transfer features add to the complexity, size, and weight of the overall system. Finally, many of these heat transfer features remain somewhat thermally isolated from devices by other components, such as insulators and adhesives, which diminishes the effectives of the heat transfer features.

SUMMARY

Provided are interconnect circuits for combined electrical and thermal energy transfer to devices connected to these circuits. Also provided are methods of fabricating such interconnect circuits. An interconnect circuit may include an electro-thermal conductor and at least one insulator providing support to different portions of the conductor with respect to each other. The insulator may include one or more openings for electrical connections and/or heat exchange with the electro-thermal conductor. The portions of the conductor may be electrically isolated from each other in the final circuit. Initially, these portions may be formed from the same conductive sheet, such as a metal foil having a thickness of at least about 50 micrometers. This thickness ensures sufficient thermal transfer in addition to providing excellent electrical conductance. In some embodiments, the conductor may include a surface coating to protect its base material from oxidation, enhancing electrical connections, and/or other purposes.

When an insulator is disposed on the device-side of the electro-thermal conductor, the electrical and thermal connections between the device and conductor may be formed through one or more openings in the insulator. In other words, in an assembly including an interconnect circuit and a device, an insulator may be disposed between the electro-thermal conductor and the device and have one or more openings for the electro-thermal conductor. This type of insulator may be referred to a device-side insulator. An insulator disposed on the opposite side of the conductor may be referred to as a back-side insulator. An interconnect circuit may include only a device-side insulator, only a back-side insulator, or both device-side and back-side insulators. In some embodiments, a back-side insulator may be disposed between and shared by two electro-thermal conductors.

A device-side insulator and/or a back-side insulator may include openings to enhance heat transfer between the electro-thermal conductor and the environment. For example, the electro-thermal conductor may be thermally coupled (through an insulator) to an external component having a substantial thermal mass and/or a large heat dissipation surface, such as a heat sink. In some embodiments, the heat sink may be a housing of an assembly containing the interconnect circuit. The thermal coupling (e.g., between the device and the electro-thermal conductor and/or between the electro-thermal conductor and the heat sink) may be provided by a thermally conductive adhesive, or by some other means. In some embodiments, the electro-thermal conductor may be thermally coupled to the heat sink directly without any intermediate insulators.

In some embodiments, an interconnect circuit comprises an electro-thermal conductor and a first insulator, which may be a device-side insulator. The electro-thermal conductor may comprise a thermal conductor portion and one or more electrical conductor portions, such as a first electrical conductor portion. The thermal conductor portion may be specific to this circuit or shared by multiple interconnect circuits. For example, multiple interconnect circuits may be arranged into an array. It should be noted that while some thermal conductivity of the electro-thermal conductor may be provided by its electrical conductor portions, the majority of the thermal conductivity is provided by the thermal conductor portion. In some embodiments, the thermal conductor portion may also be operable as one of electrical leads, similar to electrical conductor portions.

For purposes of this disclosure and unless otherwise states, the term "insulator" refers to a structure having an electrical conductivity of less than 10 S/cm. The term "conductor" refers to a structure having an electrical conductivity of at least about 10,000 S/cm. The term "thermal conductor" refers to a structure having a thermal conductivity of at least about 10 W/mK. Structures with a thermal conductivity of less than 1 W/mK may be referred to as "thermal insulators." It should be noted that a thermal conductor may be also an electrical conductor but it does not have to be. For example, a class of electrically insulating materials, such as diamond and aluminum nitride, are good thermal conductors. The materials may be used, for example, as a surface coating of the electro-thermal conductor.

Electrical conductors are typically thermally conductive. The term "electro-thermal conductor" refers to a structure having an electrical conductivity of greater than 10,000 S/cm and a thermal conductivity of greater than 10 W/mK. The term "electrically isolated" may refer to a lack of a physical connection between two electrical conductors, either directly or through one or more other electrical conductors.

It should also be noted that the total thermal conductance of a body (e.g., of a layer) is dependent on the size and shape of the body. For example, the lateral thermal conductance of a layer is generally proportional to the thickness of that layer, whereas the through-thickness thermal conductance of a layer is generally inversely proportional to its thickness. Furthermore, in some cases, a layer which is nominally a thermal insulator may be made to still have a high through-thickness thermal conductance by minimizing its thickness.

Returning to the interconnect circuit example, the thermal conductor portion may be electrically isolated from the first electrical conductor portion. For example, a gap may extend between the thermal conductor portion and the first electrical conductor portion. The gap may define the boundary of the first electrical conductor portion. In some embodiments, the footprint of the thermal conductor portion is substantially greater than the footprint of the first electrical conductor portion.

The width of the gap between two portions may be between about 100 micrometers and 3 millimeters or, more specifically, between about 250 micrometers and 1 millimeter. The aspect ratio of the gap, as defined by the width of the gap divided by the conductor thickness (which is the effective depth of the gap) may less than about 10 or, more specifically, less than about 5 or even less than about 2. The gap may be empty or filled with an adhesive.

In some embodiments, the thermal conductor portion and the first electrical conductor portion have an identical composition. Furthermore, the thermal conductor portion and the first electrical conductor portion may have an identical thickness. The combination of the identical composition and thickness may be achieved by using the same conductive sheet to form both the thermal conductor portion and the first electrical conductor portion. As such, all material properties of the thermal conductor portion and the first electrical conductor portion may be the same.

In some embodiments, the first insulator is adhered to the electro-thermal conductor and supports the thermal conductor portion and the first electrical conductor portion relative to each other. Specifically, the first insulator may keep the thermal conductor portion electrically isolated from the first electrical conductor portion. More specifically, the first insulator may be used to maintain the gap between the thermal conductor portion and the first electrical conductor portion.

The first insulator may include one or more openings for making electrical and/or thermal connections to the electro-thermal conductor. For example, the first insulator may include a first opening overlapping with at least the first electrical conductor portion. This opening may be used for making an electrical and/or thermal connection to this portion. In some embodiments, the same opening may overlap with multiple portions of the electro-thermal conductor and may be used to make multiple independent connections through the same openings. These connections may be electrically isolated from each other.

In some embodiments, the first insulator comprises a first opening and a second opening. The first opening may overlap (e.g., be aligned) with the first electrical conductor portion of the electro-thermal conductor and may be used to form an electrical connection to this portion. The second opening may overlap (e.g., be aligned) with the thermal conductor portion of the electro-thermal conductor and may be used to form at least a thermal connection to this portion. It should be noted that all electrical connections may be also operable as thermal connections. However, some thermal connections may not necessarily be used for conducting electrical current.

In some embodiments, a surface portion of the first electrical conductor portion aligned with the first opening of the first insulator is exposed. This surface portion may be free from any electrically-insulating adhesives. Likewise, a surface portion of the thermal conductor portion aligned with the second opening of the first insulator may be exposed or covered with a thermally conductive adhesive. This portion may be used to form a thermal connection and, in some embodiments, an electrical connection to the device.

In some embodiments, the first opening of the first insulator is not connected to the second opening. This separation between the first opening and the second opening may be used, for example, to prevent an electrical short between the thermal conductor portion and the first electrical conductor portion. The minimum separation distance between the openings may be at least about 0.2 millimeters or, more specifically, at least about 0.5 millimeters.

In some embodiments, the first opening is aligned with the end of the first electrical conductor portion. This feature may allow for this end to be deformed out of plane (defined by the edges of the first opening facing the first electrical conductor portion) and protrude into the first opening, for example, to form a direct electrical connection to the device. In this example, the width of the first opening may be greater than the width of the end of the first electrical conductor portion to allow the end of the first electrical conductor portion to protrude into the first opening. Alternatively, the edges of the first insulator forming the first opening are used to support this end of the first electrical conductor portion. In this example, the end of the first conductor portion may remain flat and may not protrude into the opening.

In some embodiments, the electro-thermal conductor further comprises a second electrical conductor portion. The second electrical conductor portion may be electrically isolated from the thermal conductor portion and from the first electrical conductor portion. For example, a gap may extend between the second electrical conductor portion and the thermal conductor portion. The thermal conductor portion may be disposed between the second electrical conductor portion and the first electrical conductor portion. The thermal conductor portion and the second electrical conductor portion may have an identical composition. Furthermore, the thermal conductor portion and the second electrical conductor portion may have an identical thickness. The first insulator may comprise a third opening overlapping with the second electrical conductor portion of the electro-thermal conductor, such as with an end of the second electrical conductor portion.

In some embodiments, the first electrical conductor portion may serve as a first electrical lead for the device connected to the interconnect circuit, while the second electrical conductor portion may serve as a second electrical lead. The thermal conductor portion may remain electrically floating (and not used for conducting any electrical current), may be grounded, or may serve as a third electrical lead (e.g., for voltage monitoring or a separate phase).

Alternatively, the electro-thermal conductor may include only two portions, i.e., the thermal conductor portion and the first electrical conductor portion. In these embodiments, the second electrical conductor portion is not present. The thermal conductor portion is operable as a second electrical lead for the device. In other words, the thermal conductor portion is responsible for electrical conduction and for most of the thermal conduction to/from the device.

In some embodiments, the interconnect circuit further comprises a second insulator such that the electro-thermal conductor is disposed between and adhered to both the first insulator and the second insulator. The second insulator may be a back-side insulator.

The second insulator may comprise one or more openings overlapping with at least the thermal conductor portion. The openings may be used for accessing the thermal conductor portion when, for example, forming one or more connections between the thermal conductor portion and other components (e.g., a device on the opposite side of the thermal conductor portion, a heat sink/housing on the same side, and the like). Furthermore, these openings may be used for heat exchange between the thermal conductor portion and the environment, a heat sink, or another component.

In some embodiments, the second insulator comprises a bridging portion extending between at least two openings in the second insulator. The bridging portion may overlap with both the first electrical conductor portion and the thermal conductor portion to provide support to these portions with respect to each other. In some embodiments, the bridging portion may overlap with the entire gap between two portions of the electro-thermal conductor. The width of the bridging portion may be greater than a width of the first electrical conductor portion.

In some embodiments, neither opening of the second insulator overlaps with the first electrical conductor portion. In other words, the first electrical conductor portion may be fully covered by the second insulator. The second insulator may protect the first electrical conductor portion from shorting to an external heat sink or housing. At the same time, a portion (e.g., most) of the thermal conductor portion may be exposed through the openings in the second insulator.

In some embodiments, the first insulator is adhered to the electro-thermal conductor using a first adhesive, while the second insulator is adhered to the electro-thermal conductor using a second adhesive. The melt flow index of the first adhesive may be less than a melt flow index of the second adhesive. For example, the melt flow index of the first adhesive may be about 6 dg/min or less (as defined by ASTM D1238, 2.16 kg, 190 C), whereas the melt flow index of the second adhesive may be about 10 dg/min or more. As such, the second adhesive may fill gaps between portions of the electro-thermal conductor. The first adhesive may remain substantially between the first insulator and the electro-thermal conductor without going beyond the interface between these two components. Alternatively, some of the first adhesive may go into the gap but the volume of the first adhesive in the gap may be less than the volume of the second adhesive. In some embodiments, the first adhesive and the second adhesive may be the same material. In these embodiments, gap filling with the two adhesives may be controlled by the order with which the two insulators are laminated to the electro-thermal conductor. For example, the gap may be already filled with the first adhesive when the second insulator is laminated later.

In some embodiments, the gap between the thermal conductor portion and the first electrical conductor portion is empty or, in other words, free from any solid or liquid materials. The gap may contain air or any other gases captured from the processing environment during fabrication of the interconnect circuit.

In some embodiments, the electro-thermal conductor comprises a base sublayer and a surface sublayer having a different composition than the base sublayer. The first insulator is laminated to the surface sublayer and may directly interface with the surface sublayer. Specifically, the surface sublayer is disposed between the base sublayer and the first insulator after the lamination. The base sublayer may comprise a metal selected from the group consisting of aluminum, titanium, nickel, copper, steel, alloys comprising these metals, and various combinations of these metals. The material composition of the base sublayer may be selected to achieve desired electrical conductance and the thermal conductance of the overall electro-thermal conductor, while providing adequate mechanical strength and support and having low cost.

The surface sublayer may comprise a metal selected from the group consisting of tin, lead, zinc, nickel, silver, palladium, platinum, gold, indium, tungsten, molybdenum, chrome, and copper. The material of the surface sublayer may be selected to protect the base sublayer from oxidation, improve surface conductivity when forming electrical and/or thermal contact to the device, improve adhesion to the electro-thermal conductor, and/or other purposes. For example, aluminum may be used for the base sublayer. While aluminum has a good thermal conductivity and a good electrical conductivity, it easily forms a surface oxide when exposed to air. Unlike metallic aluminum, aluminum oxide has a poor electrical conductivity and may not desirable at the interface between the electro-thermal conductor and the device. Coating aluminum with one of tin, lead, zinc, nickel, silver, palladium, platinum, gold, indium, tungsten, molybdenum, chrome, or copper before aluminum oxide is formed mitigates this problem and allows using aluminum for the base sublayer without compromising the electrical conductivity between the electro-thermal conductor and the device. Furthermore, it has been found that aluminum is superior to copper from manufacturability, mechanical strength, cost, and other factors. While aluminum has been used as a heat sink, the use of aluminum for electrical conductors have been limited due to surface oxides.

The surface sublayer may have a thickness of between about 0.01 micrometers and 10 micrometers or, more specifically, between about 0.1 micrometers and 1 micrometer. For comparison, the thickness of the base sublayer may be between about 10 micrometers and 1000 micrometers or, more specifically, between about 100 micrometers and 500 micrometers. As such, the base sublayer may represent at least about 90% or, more specifically, at least about 95% or even at least about 99% of the electro-thermal conductor by volume.

While some of the surface sublayer may be laminated to the first insulator, a portion of the surface sublayer may remain exposed. This portion may be used to form electrical and/or thermal contacts between the electro-thermal conductor and the device such as soldered contacts, for example. The surface sublayer may be also used to improve adhesion between the first insulator and the electro-thermal conductor. In some embodiments, the surface sublayer may be coated with an anti-corrosion coating such as organic solderability preservative (OSP).

In some embodiments, the electro-thermal conductor further comprises one or more intermediate sublayers disposed between the base sublayer and the surface sublayer. The one or more intermediate sublayers have a different composition than the base sublayer and the surface sublayer. For example, the intermediate sublayer may comprise a metal selected from the group consisting of chromium, titanium, nickel, vanadium, zinc, and copper. In some embodiments, the one or more intermediate sublayers may help prevent intermetallic formation between the base sublayer and the surface sublayer.

In some embodiments, the electro-thermal conductor comprises an insulating coating forming a surface of the electro-thermal conductor opposite of the first insulator. At least a portion of this surface may remain exposed in the interconnect circuit and may be used for heat removal from the interconnect circuit. The insulating coating may be disposed on the side opposite of the device-side. In these embodiments, the electro-thermal conductor may be used for electrical conduction without being protected by additional insulators. For example, the entire surface may be exposed in the interconnect circuit. Optionally, the insulating coating may comprise a material selected from the group consisting of silicon dioxide, silicon nitride, aluminum oxide, boron nitride, aluminum nitride, diamond, and silicon carbide.

Provided also is an assembly comprising a device and an interconnect circuit connected to the device. Various examples of the interconnect circuit are described elsewhere. In some embodiments, the device is selected from the group consisting of light emitting diodes (LEDs), diodes, transistors, resistors, capacitors, inductors and other electronic devices. These types of devices are relatively small in size but tend to generate a lot of heat and heat dissipation provided by the interconnect circuit described herein may be particularly important for these types of devices.

BRIEF DESCRIPTION OF THE DRAWINGS

FIGS. 6A-7C illustrate different stages and examples during forming of an interconnect circuit.

FIGS. 11A-11C are schematic cross-sectional views of different examples of an interconnect circuit, in accordance with some embodiments.

These and other embodiments are described further below with reference to the figures.

DETAILED DESCRIPTION

Introduction

As electrical and electronic devices become smaller and/or more powerful, forming robust electrical connections and providing thermal management to these devices becomes progressively more difficult and important. The scale-down of many types of devices have been limited by the electrical connection and thermal management issues. For example, LEDs provide efficient ways of generating light and can be used for many applications, such as displays, light bulbs, and the like. Yet, LEDs are small and generate substantial amounts of concentrated heat. Excessive heating, if not controlled, may cause various issues with LED performance and/or reliability, with connections to these LEDs, and even with surrounding devices.

Many conventional circuits focus on signal transmission rather than robust electrical connections and thermal management and, as a result, use very small (thin) electrical leads. For example, conductive traces in printed circuit boards (PCBs) are primarily formed from plated or etched copper and typically have a thickness of less than 50 micrometers. Forming thicker conductive traces using plating and etching is often not practical or even possible. While these conventional leads may be sufficient for signal transmission, they fail as effective thermal conductors because of their small thickness as will now be explained with reference to FIGS. 1A-1C.

Figure 1A:
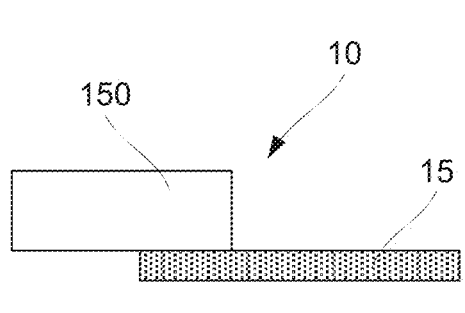
FIG. 1A is a schematic illustration of an assembly including a device and a conventional electrical conductor.
Figure 1B:
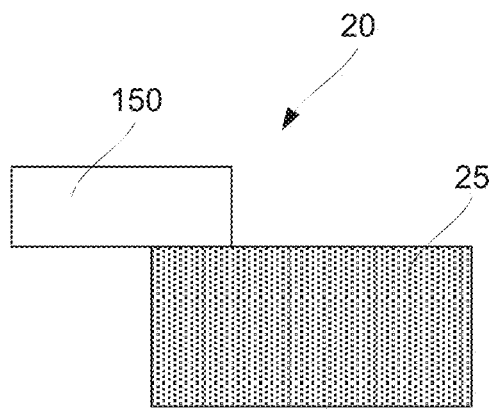
FIG. 1B is a schematic illustration of another assembly including a device and an electro-thermal conductor described herein, in accordance with some embodiments.
Figure 1C:
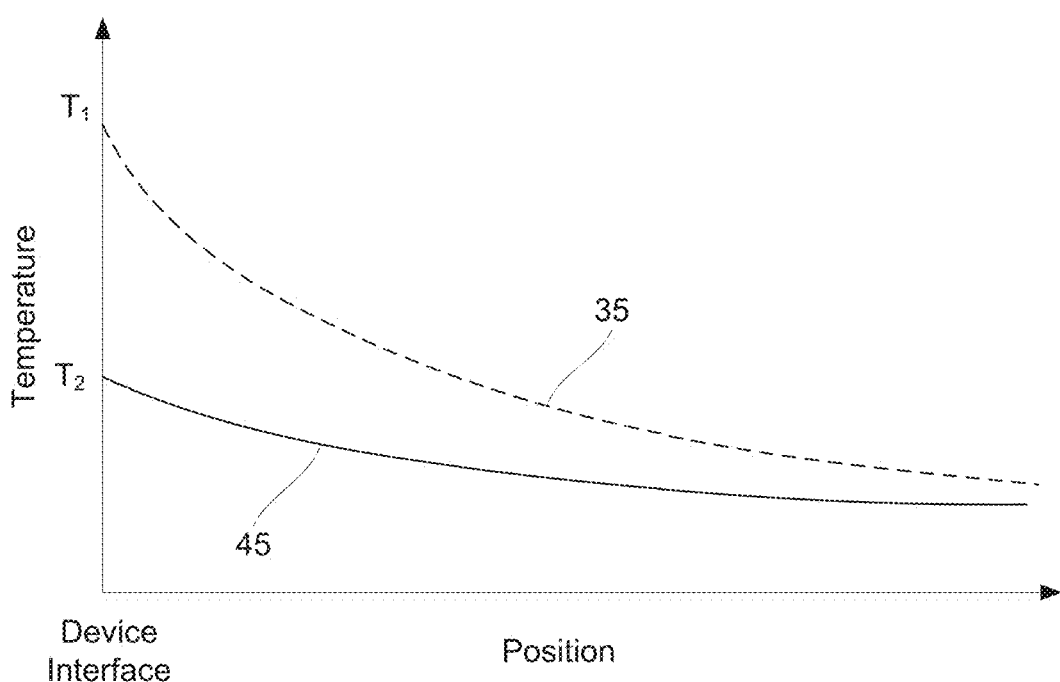
FIG. 1C illustrates thermal profiles for the conductor of the assembly shown in FIG. 1A and for the electro-thermal conductor of the assembly shown in FIG. 1B.

Specifically, FIG. 1A is a schematic illustration of assembly 10 including device 150 and conventional thin conductor 15 (e.g., being less than 50 micrometers thick). FIG. 1B is a schematic illustration of assembly 20 including device 150 and electro-thermal conductor 25 described herein. Electro-thermal conductor 25 is much thicker than conventional conductor 15. In some embodiments, the thickness of electro-thermal conductor 25 is at least about 100 micrometers or, more specifically, at least about 200 micrometers or even at least about 500 micrometers. While both conventional conductor 15 and electro-thermal conductor 25 may have a sufficient electrical conductivity to power device 150, the heat dissipation provided by these conductors is quite different. Corresponding thermal profiles for conductor 15 and electro-thermal conductor 25 as a function of the distance from the device interface are schematically presented in FIG. 1C. Specifically, line 35 represents conductor 15, while line 45 represent electro-thermal conductor 25. Because electro-thermal conductor 25 is much thicker than conductor 15, the temperature at the device interface is lower for electro-thermal conductor 25. This lower interface temperature can be beneficial from operating standpoints for many types of devices, such as LEDs. Not only do these devices have better operating performance at lower temperatures, but lower interface temperatures may also allow using new types of devices, operate at higher operating powers, and/or have greater packing density, and other like characteristics. For example, the ability to operate LEDs at a higher power can be used to reduce the number of LEDs for a given light output. In addition, densely packed LEDs with good thermal management may be used for backlighting or edge-lighting of displays and other like applications.

Figure 1D:
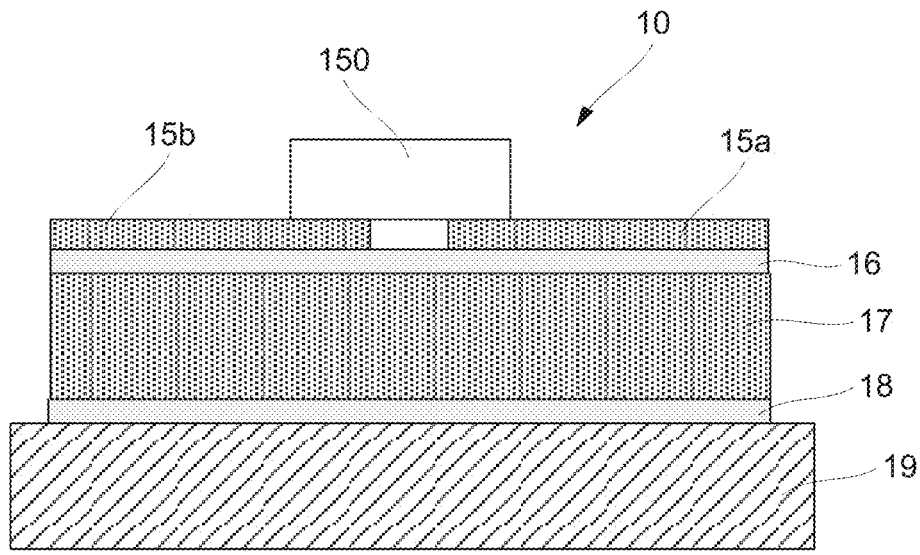
FIG. 1D is a schematic illustration of an assembly including a device and a conventional electrical conductor adhered to an internal heat sink supported on an external heat sink, in accordance with some embodiments.

Even if conventional circuits use heat sinks and other like components for thermal management, these components typically have poor thermal coupling to heat generating (consuming) devices of these circuits. FIG. 1D is a schematic cross-sectional representation of metal core PCB (MCPCB) assembly 10 showing electrical conductors 15a and 15b positioned over internal adhesive 16 that bonds these conductors to heat sink 17. As described above, electrical conductors 15a-15b do not provide sufficient thermal management because of their small thickness. As a result, heat sink 17 is added to mitigate this issue. However, internal adhesive 16 disposed between heat sink 17 and electrical conductor 15a-15b is typically a thermal insulator. The thickness of internal adhesive 16 may be substantial because of surface imperfections of electrical conductors 15a-15b and/or heat sink 17. Overall, the thermal coupling between heat sink 17 and device 150 is marginal and a lot worse than, for example, between electrical conductors 15a-15b and device 150. As a reference, this assembly 10 is shown mounted on external heat sink 19 (e.g., a housing) using mounting adhesive layer 18.

Figure 1E:
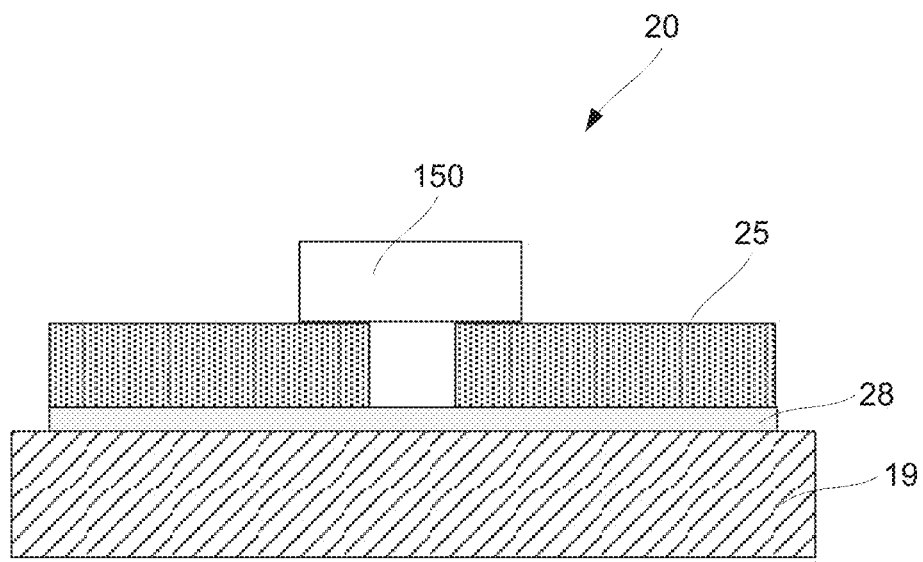
FIG. 1E is a schematic illustration of another assembly including a device and an electrical conductor, which is also operable as an internal heat sink and is supported on an external heat sink, in accordance with some embodiments.

FIG. 1E is a schematic illustration of assembly 20 having electro-thermal conductor 25 connected to device 150. There is a direct thermal coupling between electro-thermal conductor 25 and device 150 with no interfering thermal insulator, such as an adhesive and the like. As such, electro-thermal conductor 25 would be more effective in thermal management of device than heat sink 17 of MCPCB assembly 10 described above. Also, as a reference, this assembly 20 is shown mounted on external heat sink 19 (e.g., a housing) using mounting adhesive layer 28.

Another aspect of assembly 20 (in comparison to assembly 10) is its flexibility. Because of the more direct thermal coupling between electro-thermal conductor 25 and device 150, electro-thermal conductor 25 may be thinner than internal heat sink 17 of assembly 10 thereby helping flexibility. Furthermore, the reduced layer count of assembly 20 (in comparison to assembly 10) provides fewer failure (e.g., delamination) points.

Thermal modeling was used to analyze various examples of assemblies described above and illustrated in FIGS. 1A-B and FIGS. 1D-1E. For simplicity, the heat is assumed to flow out through only one surface of the circuit (e.g., the device-side surface or the back-side surface). This assumption closely resembles many types of circuits (e.g., LED arrays) having thermally insulating structures on at least one side.

Referring to assemblies 10 and 20 illustrated in FIGS. 1A and 1B, a first thermal model assumes a basic configuration of a one-dimensional multi-LED array with spacing of 50 millimeters between LEDs. Each LED has a power of 5 W and efficiency of 25%. This thermal model compares heat spreading performance of a 35-micrometer thick copper structure (representative of a PCB) and a 250-micrometer thick aluminum structure (one example of electro-thermal conductors described herein). This thermal model also accounts for a thermal insulator (0.2 W/mK) positioned on the back-side surface of these heat spreading structures. Different thicknesses of the thermal insulator were explored.

Even though the thermal conductivity of aluminum is only 55-60% that of copper, the 250-micrometer thick aluminum structure showed superior heat spreading performance across different thicknesses of the thermal insulator as shown in TABLE 1 below. Specifically, the temperature increase at the LED solder pad relative to the ambient temperature was almost a factor of two lower for the 250-micrometer thick aluminum structure than for the 35-micrometer thick copper structure across all thicknesses of the thermal insulator. This superior performance is attributed to much greater thickness of the 250-micrometer thick aluminum structure, which is a key factor in heat spreading.

TABLE 1

| Thickness of Thermal Insulator (0.2 W/mK) | Temperature Increase of LED solder pad relative to Ambient Temperature | |
|---|---|---|
| | 35-micrometer thick copper | 250-micrometer thick aluminum |
| 100 micrometers | 13.2° C. | 5.9° C. |
| 500 micrometers | 29.7° C. | 13.7° C. |
| 1000 micrometers | 42° C. | 20.7° C. |

Another thermal model compares heat dissipation within two stacks roughly corresponding to assembly examples illustrated in FIGS. 1D and 1E. The first stack includes a one-dimensional array of 5 W LEDs spaced 10 millimeters apart, a 100-micrometer thick aluminum structure, a layer of 125-micrometer thick mounting adhesive (i.e., LED/100 μm-Al/125 μm-adhesive stack). The second stack includes the same LED array, a 35-micrometer thick copper structure, a first layer of 125-micrometer thick internal adhesive, a 1000-micrometer thick aluminum structure, and a second layer of 125-micrometer thick mounting adhesive (i.e., LED/35 um-Cu/125 μm-adhesive/1000 um-Al/125 μm-adhesive stack). The LED efficiency was also 25% in this thermal model. The thermal conductivity of the mounting adhesive and of the internal adhesive is assumed to be the same and equal to 0.7 W/mK. This level of thermal conductivity may be obtained in an inorganic particle-filled dielectric film or in a thermally conductive pressure-sensitive adhesive (PSA) film, for example. The modeling results predict that the temperature increase at the LED solder pad relative to the ambient temperature was 5.7° C. for the first stack and 11.4° C. for the second stack. Even though the second stack has a much larger heat spreader, i.e., the 1000-micrometer thick aluminum structure, this heat spreader is thermally isolated from the LED and the 35-micrometer thick copper structure by the internal adhesive layer. As such, the efficiency of the heat spreader is substantially diminished.

Described herein are various examples of an electro-thermal conductor that provide both electrical connections to one or more devices and, at the same time, thermal management to these devices as, for example, shown in FIG. 1E. Both electrical connections and thermal management are provided by the same metallic layer. This layer may include multiple portions electrically isolated from each other, but they may be all positioned within the same plane when the interconnect circuit is flat. This is contrary to conventional approaches of separating electrical connections and thermal management functions as, for example, shown in FIG. 1D.

While the following description generally refers to and illustrates a single device connected to the circuit, one having ordinary skill in the art would understand that the same interconnect circuit may be used for connecting to multiple devices (e.g., connected in series, parallel, or various combinations of these connections schemes). In some embodiments, multiple interconnect circuits may be arranged into an array and sharing portions (e.g., a thermal conductor portion) of these circuits. Furthermore, one having ordinary skill in the art would understand that the interconnect circuit may be used for connecting to various types of devices, such as LEDs, batteries, power resistors, power diodes, power transistors, etc. In some embodiments, the interconnect circuit may be particularly well-suited to thermal dissipation from devices which generate more than 1 W/cm$^2$ of heat.

Examples of Interconnect Circuits and Assemblies Using Such Interconnects

Figure 2A:
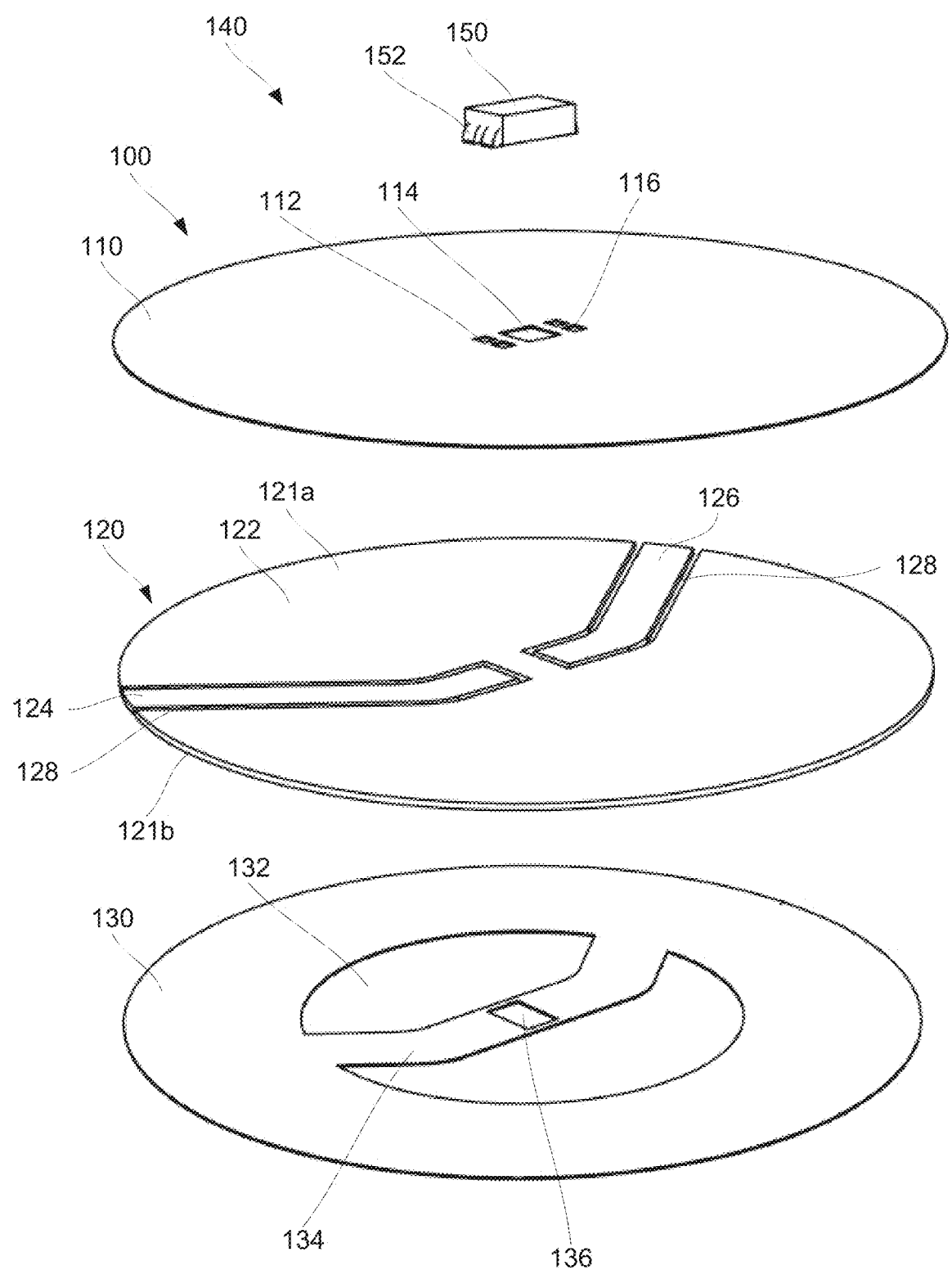
FIG. 2A is an exploded perspective view of an assembly including an interconnect circuit having an electro-thermal conductor disposed between two insulators, in accordance with some embodiments.

FIG. 2A is an exploded perspective view of assembly 140 including interconnect circuit 100 and device 150, in accordance with some embodiments. Device 150 shown in FIG. 2A is not necessarily a part of interconnect circuit 100. In some embodiments, device 150 is a light emitting diode (LED). This type of device may be relatively small in size but tends to generate a lot of heat. Heat dissipation provided by interconnect circuit 100 described herein is particularly important for this type of device.

In some embodiments, assembly 140 may include other components, such as external heat sinks (e.g., a housing, plate, or post), power sources, and the like as further described below. Note that while the assemblies shown in FIG. 2A and other figures are depicted with a circular shape or disc shape, these assemblies may take on any other shape suitable for its application.

Figure 2B:
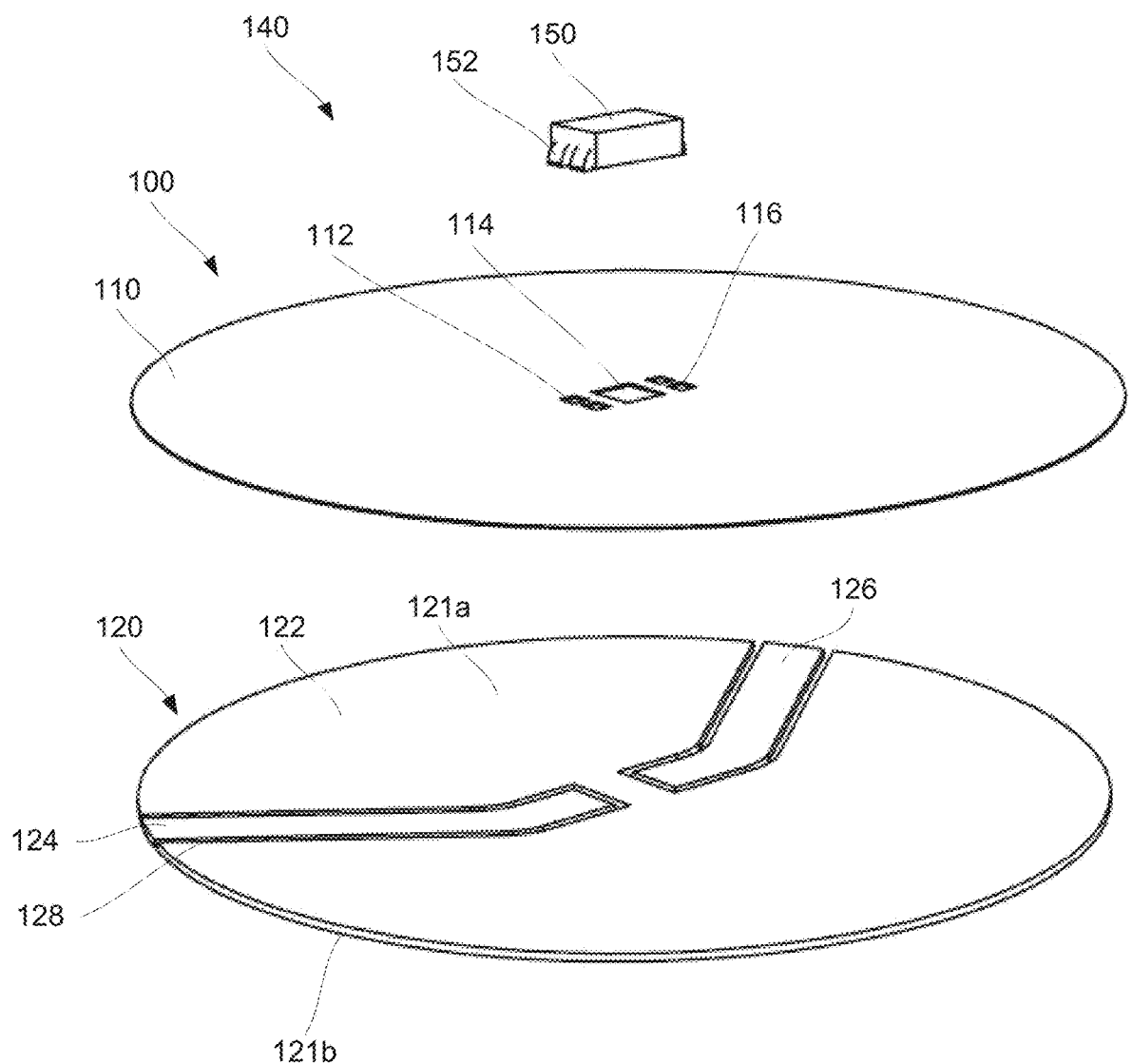
FIG. 2B is an exploded perspective view of an assembly including another interconnect circuit having an electro-thermal conductor and one insulator disposed on the device-side of the conductor, in accordance with some embodiments.

Interconnect circuit 100 may comprise electro-thermal conductor 120 and at least one insulator (e.g., first insulator 110 or second insulator 130). In some embodiments, interconnect circuit 100 comprises only first insulator 110 but not second insulator 130 as, for example, schematically shown in FIGS. 2B and 2E. In this case, back-side 121b of electro-thermal conductor 120 may remain exposed and, for example, available for heat transfer. First insulator 110 may be laminated to device-side 121a of electro-thermal conductor 120. Continuing with this example, the surface of back-side 121b may be electrically insulating (e.g., due to an insulating coating) even though the bulk of electro-thermal conductor 120 may be electrically conductive.

Figure 2C:
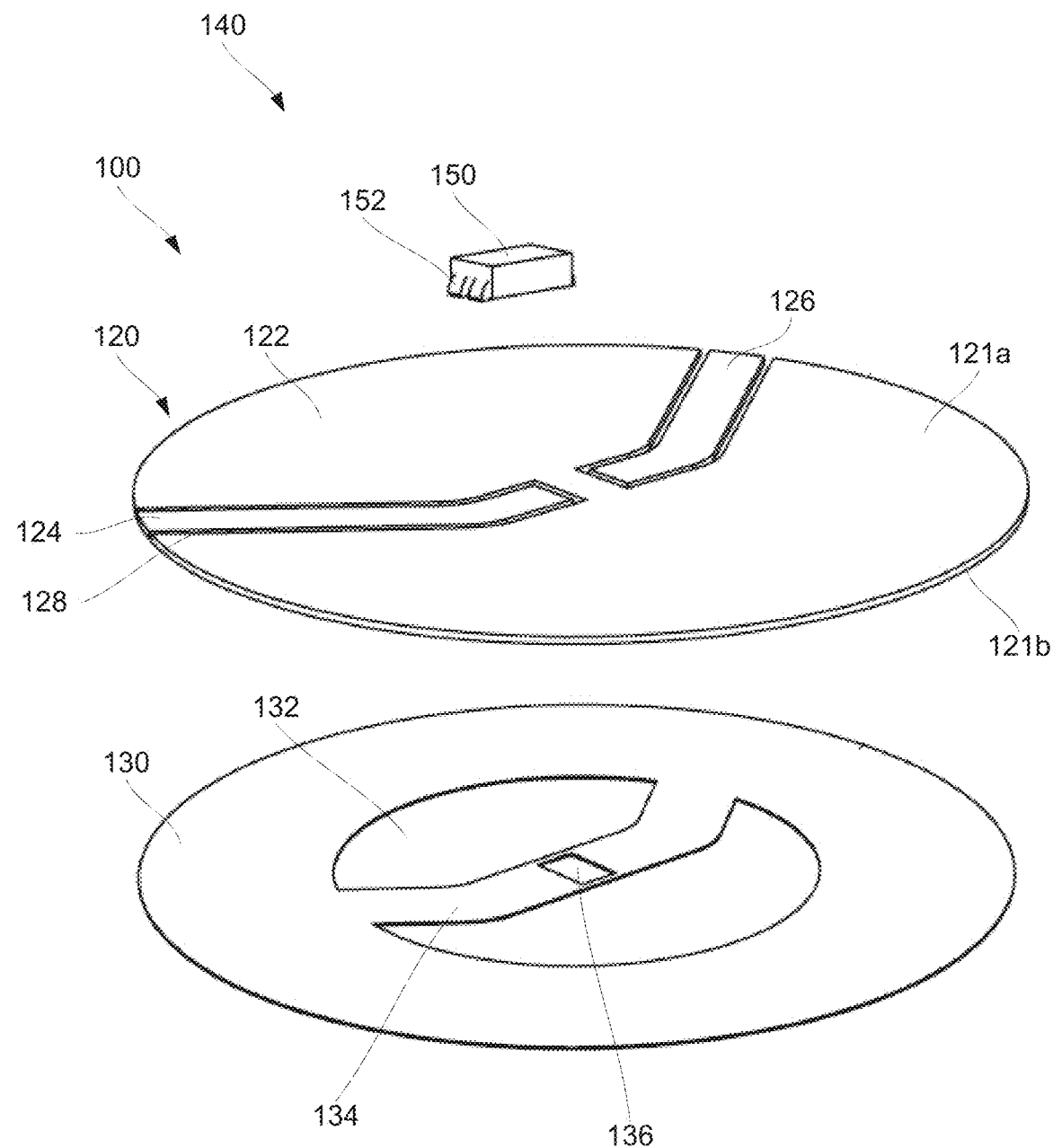
FIG. 2C is an exploded perspective view of an assembly including yet another interconnect circuit having an electro-thermal conductor and one insulator disposed on the backside of the conductor, in accordance with some embodiments.
Figure 2D:
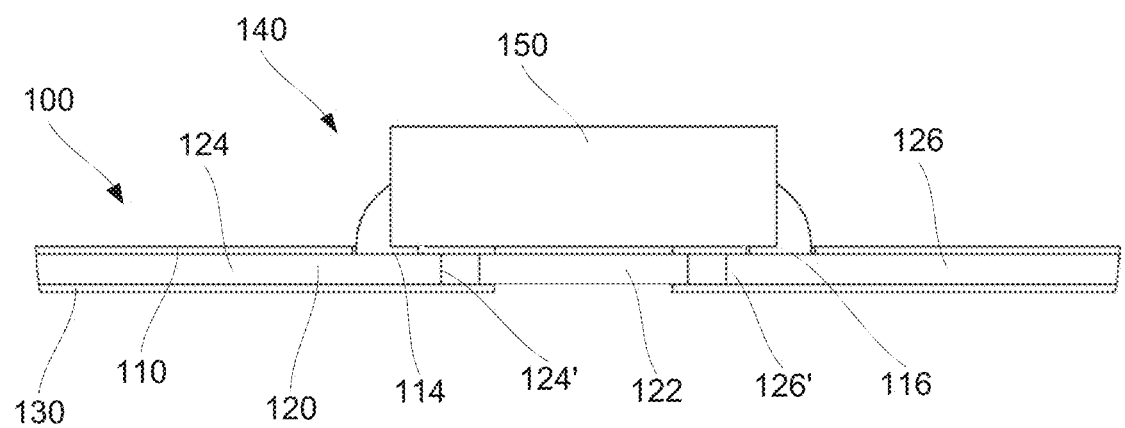
FIG. 2D is a schematic cross-sectional view of the assembly shown in FIG. 2A, in accordance with some embodiments.
Figure 2E:
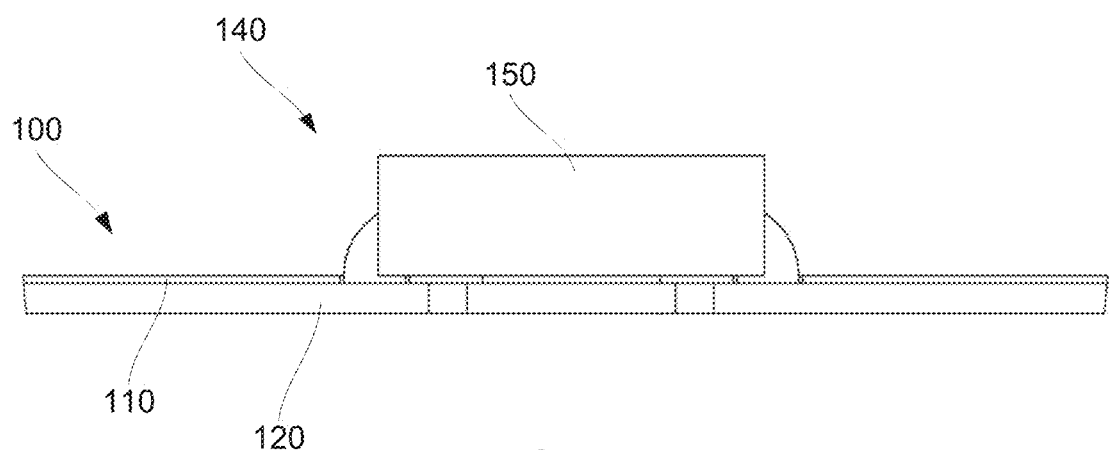
FIG. 2E is a schematic cross-sectional view of the assembly shown in FIG. 2B, in accordance with some embodiments.
Figure 2F:
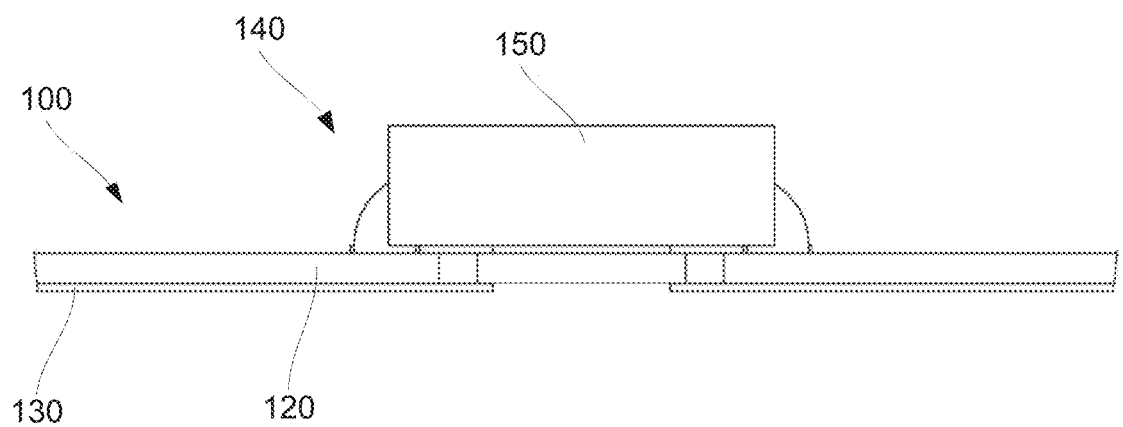
FIG. 2F is a schematic cross-sectional view of the assembly shown in FIG. 2C, in accordance with some embodiments.

In some embodiments, interconnect circuit 100 may comprise second insulator 130 but not first insulator 110 as, for example, schematically shown in FIGS. 2C and 2F. In this case, device-side 121a of electro-thermal conductor 120 may remain exposed and, for example, available for heat transfer, forming electrical connections to device 150 and other components, and the like. It should be noted that device-side 121a may have an electrically insulating surface despite the bulk of electro-thermal conductor 120 being electrically conductive. Second insulator 130 is laminated to back-side 121b of electro-thermal conductor 120 in these embodiments.

In some embodiments, interconnect circuit 100 may comprise both first insulator 110 and second insulator 130 as, for example, schematically shown in FIGS. 2A and 2D. Electro-thermal conductor 120 is disposed between these insulators such that first insulator 110 is laminated to device-side 121a of electro-thermal conductor 120 and second insulator 130 laminated to back-side 121b.

Figure 8A:
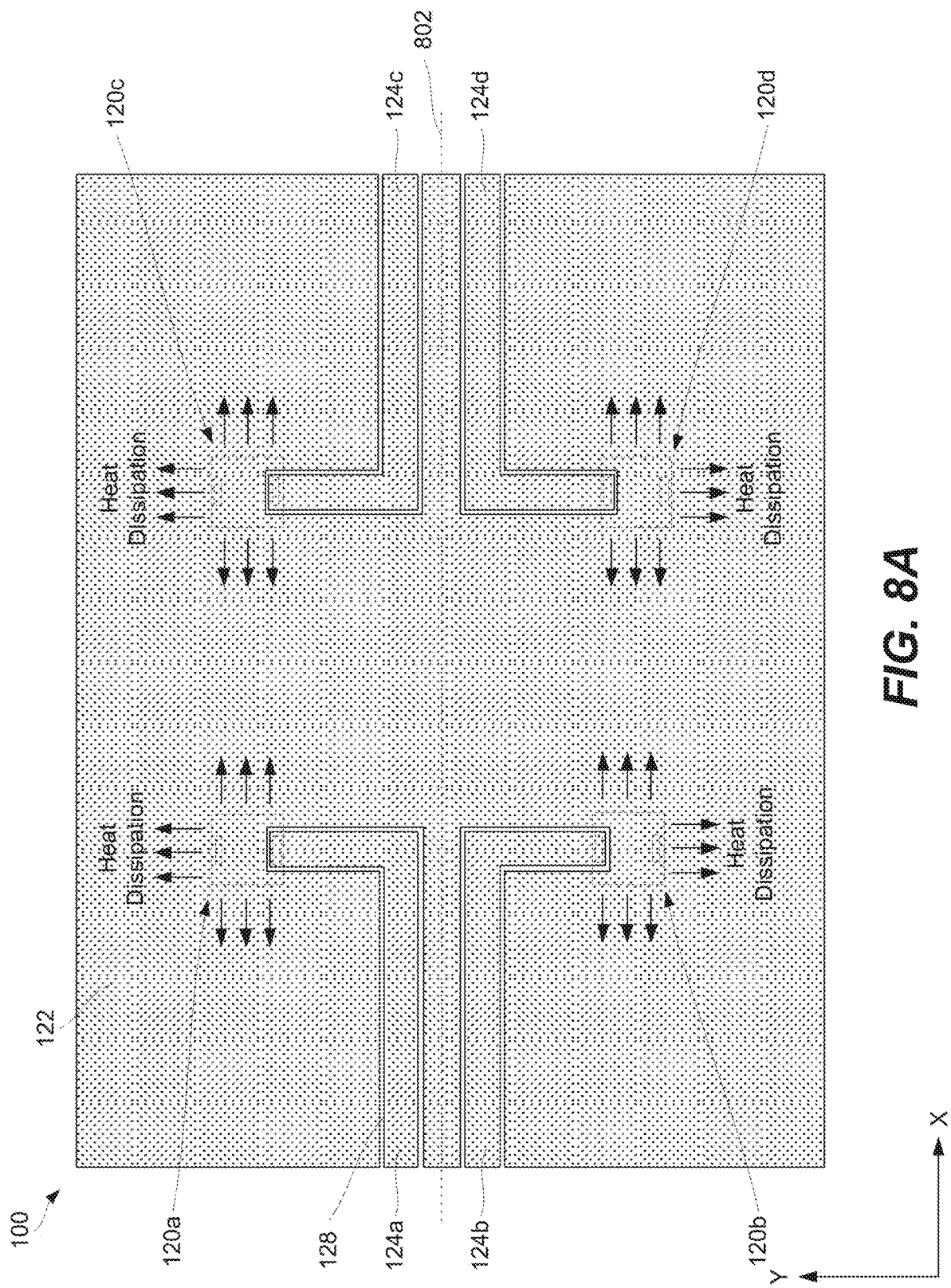
FIGS. 8A-8B are schematic representations of interconnect circuits having two dimensional arrays formed by electro-thermal conductors, in accordance with some embodiments.
Figure 8B:
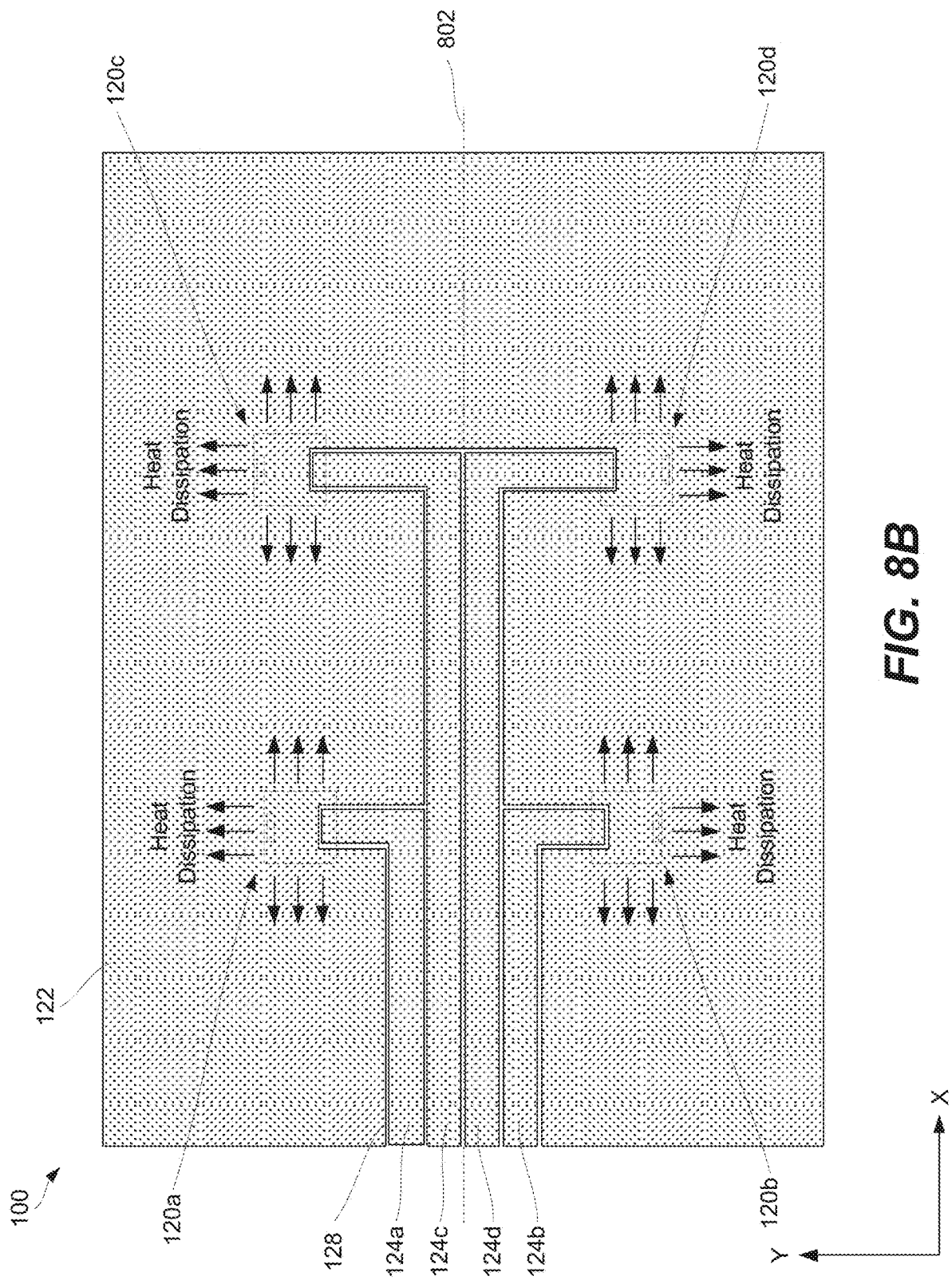
Figure 9A:
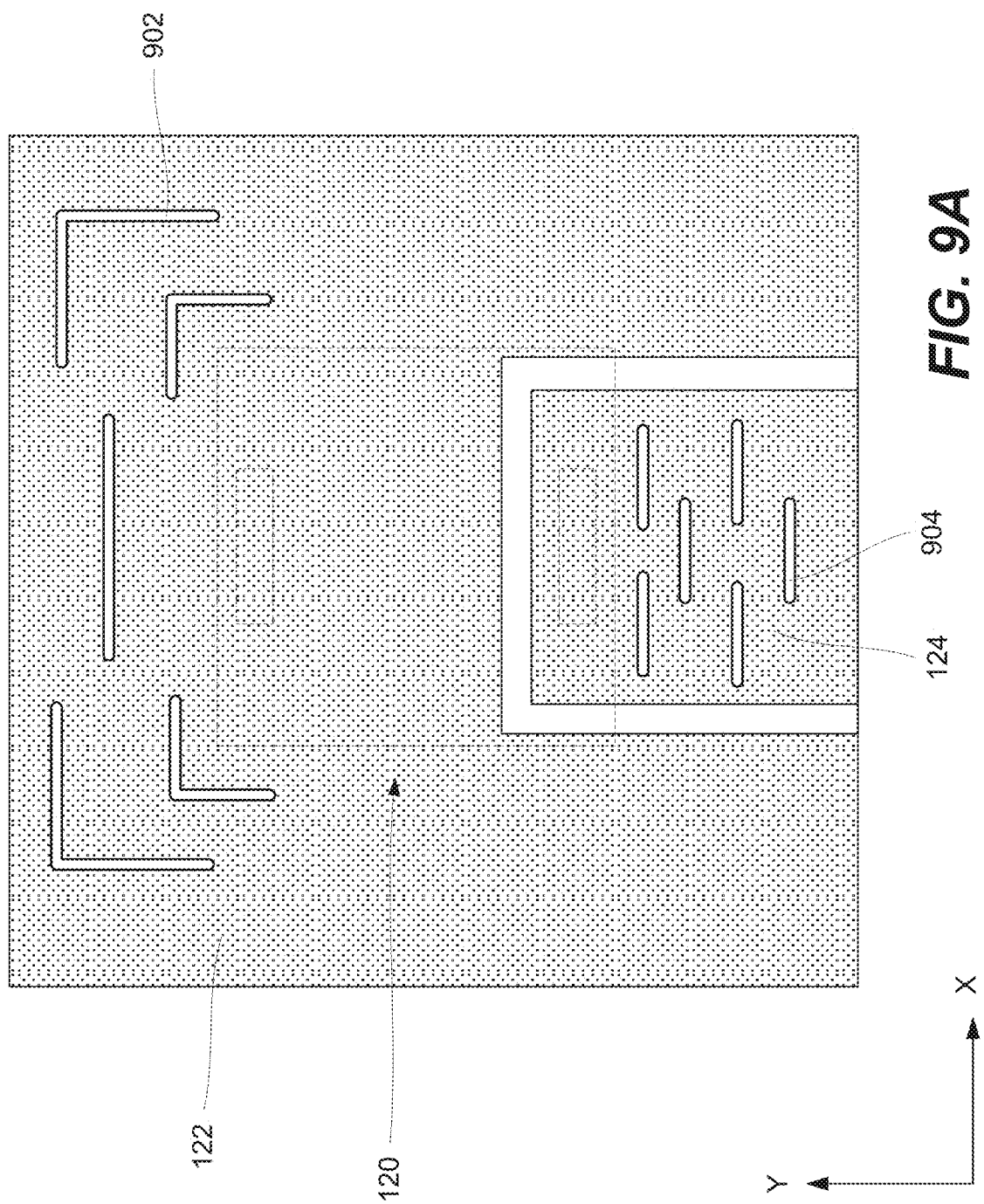
FIGS. 9A-9B are two examples of electro-thermal conductors comprising stress relieving openings disposed on thermal conductor and electrical conductor portions, in accordance with some embodiments.
Figure 9B:
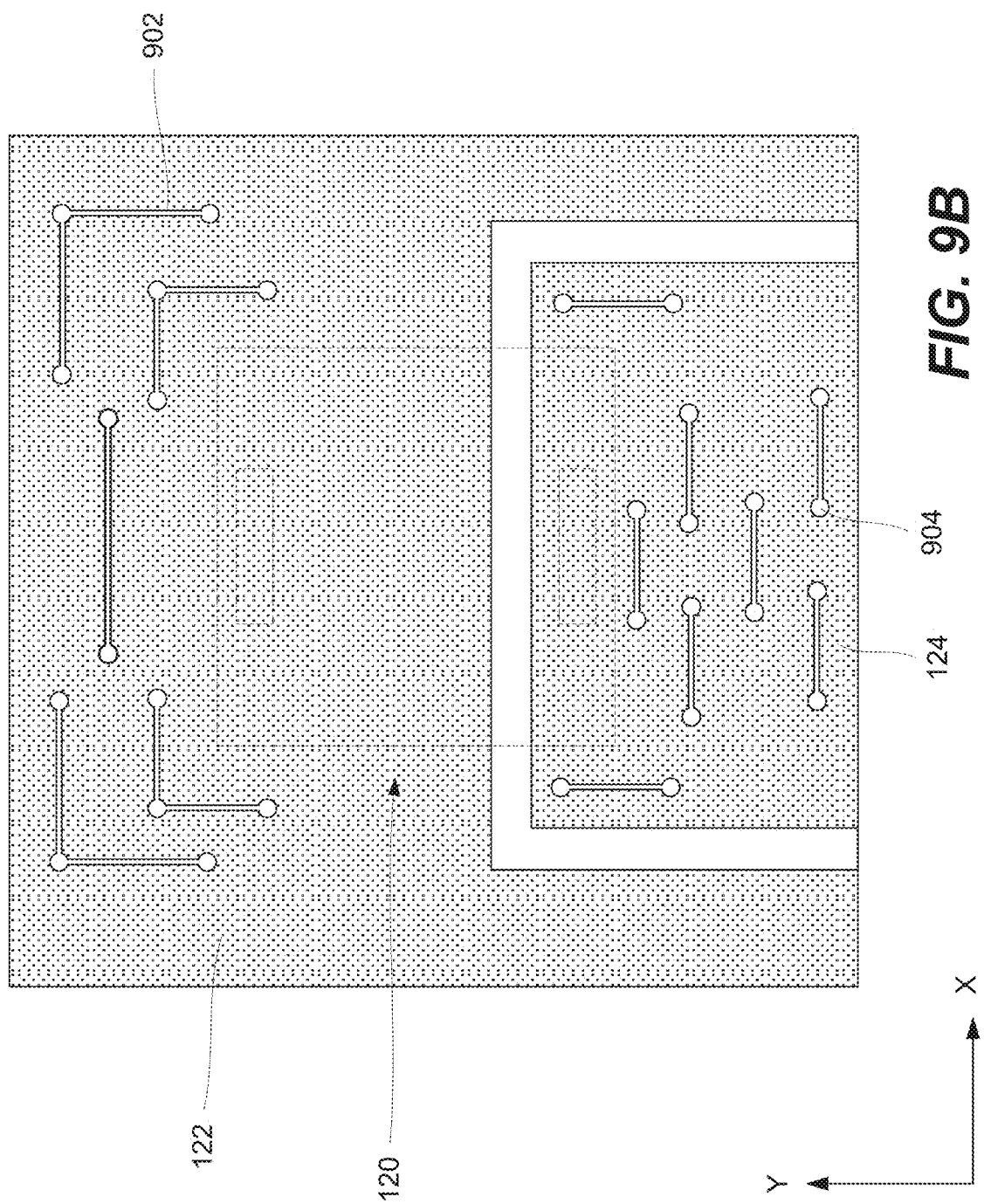

In some embodiments, interconnect circuit 100 includes multiple electro-thermal conductors 120 as, for example, shown in FIGS. 8A-8B. Such interconnect circuit 100 may be used to interconnect a two-dimensional array of LEDs, such as in an LED television backlight, for example. Electro-thermal conductors 120 may be arranged into arrays, such as one dimensional arrays and two dimensional arrays. Different electro-thermal conductors 120 may share some components. For example, electro-thermal conductors 120a-120d shown in FIGS. 8A-8B share thermal conductor portion 122. At the same time, each of electro-thermal conductors 120a-120d is individually addressable using separate electrical conductor portions 124a-124d, which are electrically isolated from thermal conductor portion 122. These electro-thermal conductors 120a-120d may be connected to one or more drivers at the edge of the interconnect circuit 100, as might be utilized in an LED backlight with local dimming, for example. To provide the most heat exchange within thermal conductor portion 122, electrical conductor portions 124a-124d may be formed as narrow strips extending along center line 802 between adjacent rows of electro-thermal conductors 120a-120d and extending straight from center line 802 to electro-thermal conductors 120a-120d. As such, thermal conductor portion 122 forms the most perimeter of each of electro-thermal conductors 120a-120d to ensure the most heat exchange with devices later connected to electro-thermal conductors 120a-120d. It should be noted that gaps 128 used for electrical insulation of different portions of electro-thermal conductors 120a-120d may be considered as thermal barriers and should be avoided if possible on the thermal path.

In some embodiments, each of the length and width of interconnect circuit 100 is at least about 500 millimeters or even at least about 1000 millimeters. It should be noted that electroplating and/or etching techniques are generally not capable of processing such large circuits uniformly.

Electro-Thermal Conductor Examples

Electro-thermal conductor 120 may comprise thermal conductor portion 122 and at least one electrical conductor portion, such as first electrical conductor portion 124 and/or second electrical conductor portion 126. In some embodiments, multiple electrical conductor portions are used, e.g., both first electrical conductor portion 124 and second electrical conductor portion 126. Thermal conductor portion 122 may be electrically biased, neutral, floating, grounded, or used as an electrical conductor in addition to being a thermal conductor. It should be noted that one or more electrical conductor portions may also provide some thermal conduction. However, the thermal conduction provided by thermal conductor portion 122 may be greater than that provided by electrical conductor portions.

In some embodiments, thermal conductor portion 122 and all electrical conduction portions (e.g., at least electrical conductor portion 124) are formed from the same material. For example, the same sheet of a metal (e.g., metal foil) may be processed to form both thermal conductor portion 122 and all electrical conductor portions (e.g., at least electrical conductor portion 124). As such, thermal conductor portion 122 and first electrical conductor portion 124 may have an identical composition and an identical thickness.

The thermal conductivity of the bulk material forming all portions of electro-thermal conductor 120 may be at least about 10 W/mK or, more specifically, at least about 50 W/mK. The bulk material may have an electrical conductivity of at least about $10^4$ S/cm or even at least about $10^5$ S/cm. It should be noted that one or both surfaces of electro-thermal conductor 120 may be electrically insulating (e.g., due to a surface coating) with the exception of contact pads to form electrical connections to device 150. The bulk material may be selected from the group consisting of aluminum, titanium, nickel, copper, steel, alloys comprising these metals, and combinations of these materials. Electro-thermal conductor 120 may have a thickness of at least about 50 micrometers or, more specifically at least about 100 micrometers. In some embodiments, the thickness is between about 50 micrometers and 5,000 micrometers or, more specifically, between about 100 micrometers and 500 micrometers, primarily to ensure adequate heat transfer. The thickness may be chosen to primarily facilitate the flow of heat away from device 150, with a thicker layer generally providing a better transfer of heat across a heat spreader region, which includes thermal conductor portion 122. Without being restricted to any particular theory, it is believed that most of the materials suitable for electro-thermal conductor 120 and listed above would also provide sufficient electrical conductivity for device 150 at the above-listed thickness ranges.

Forming different portions of electro-thermal conductor 120 may involve forming gaps 128 in the sheet as, for example, shown in FIG. 2A. These gaps 128 define the boundaries of each portion. As such, the thermal properties, electrical properties, and other properties of thermal conductor portion 122 and all electrical conductor portions may be the same. However, the footprint and shape of thermal conductor portion 122 and electrical conductor portions may be different. For example, thermal conductor portion 122 may have a much larger overall footprint than first electrical conductor portion 124, e.g., at least two times greater, at least five times greater, or even at least ten times greater. Furthermore, gaps 128 provide electrical isolation of different portions. For example, thermal conductor portion 122 is electrically isolated from first electrical conductor portion 124, which may be surrounded by thermal conductor portion 122 as, for example, shown in FIG. 2A. Gap 128 may be empty from any solid or liquid materials as, for example, shown in FIG. 4E or filled with one or more electrically insulating materials (e.g., an adhesive) as, for example, shown in FIG. 4B and further described below.

The width of gap 128 may be between about 100 micrometers and 1 millimeter or, more specifically, between about 200 micrometers and 500 micrometers. The aspect ratio of gap 128, as defined by the width of the gap divided by the conductor thickness, may less than about 10 or, more specifically, less than about 5 or even less than about 2. A similar gap may be present between thermal conductor portion 122 and second electrical conductor portion 126. The sidewalls of gap 128 may be parallel to each other throughout the thickness of electro-thermal conductor 120 as, for example, shown in FIG. 4A. In other examples, the sidewalls of gap 128 may be parallel to each other while not being perpendicular to the top and bottom surfaces of electro-thermal conductor 120 (in other words, the cross-section of the gap 128 may have the shape of a parallelogram).

In some embodiments, electro-thermal conductor 120 comprises second electrical conductor portion 126 in addition to first electrical conductor portion 124 as, for example, shown in FIGS. 2A-2C. Second electrical conductor portion 126 may be electrically isolated from thermal conductor portion 122 and from first electrical conductor portion 124. Second electrical conductor portion 126 may be surrounded by thermal conductor portion 122 and separated from thermal conductor portion 122 by gap 128 as, for example, shown in FIG. 2A. Gap 128 between second electrical conductor portion 126 and thermal conductor portion 122 may be similar to gap 128 between first electrical conductor portion 124 and thermal conductor portion 122. In some embodiments, thermal conductor portion 122 may substantially surround all electrical conductor portions of the same interconnect circuit 100, while still providing pathways for electrical conductor portions to conduct electrical current to other devices, to a power source, and/or to ground.

Figure 3A:
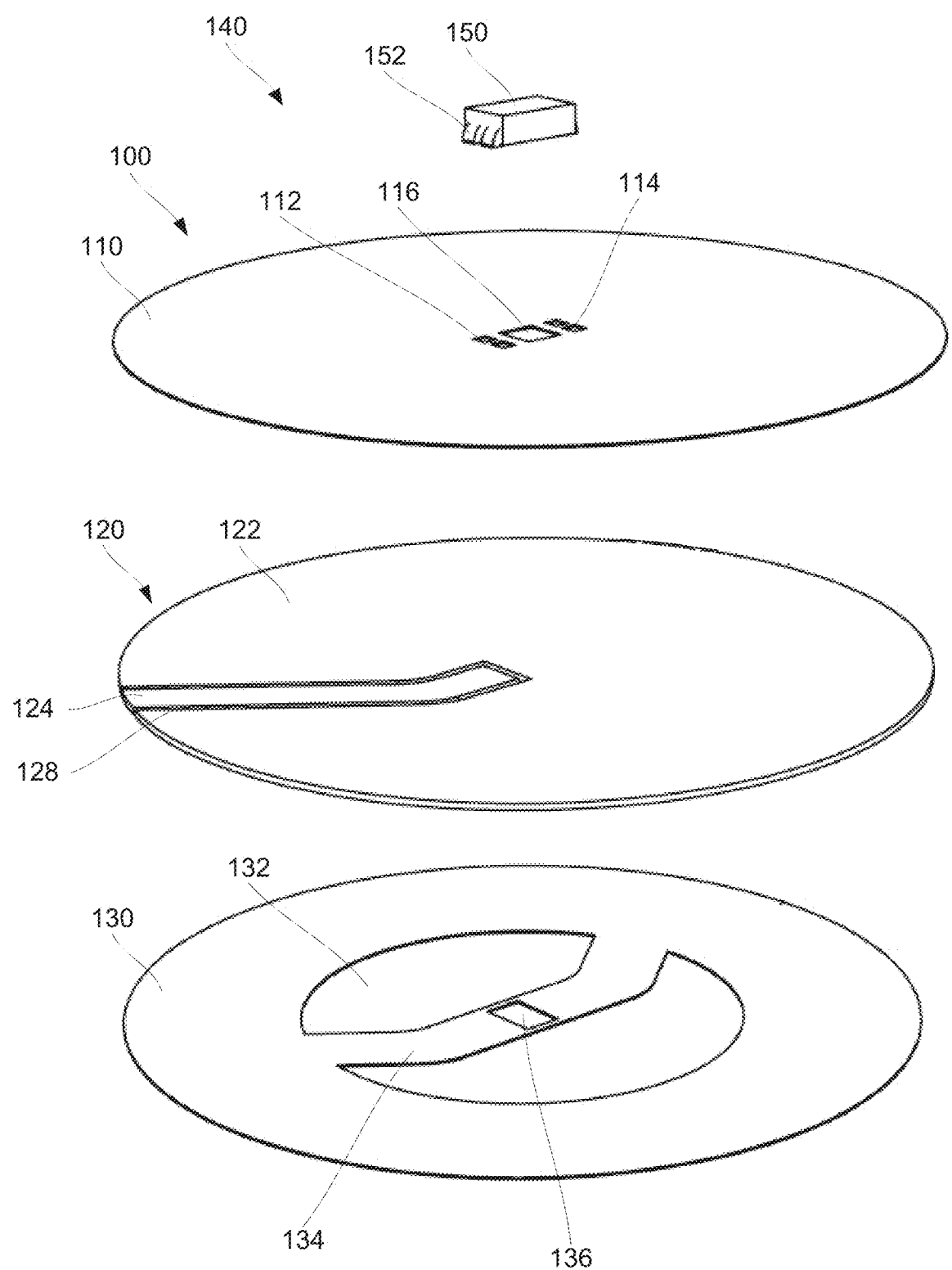
FIG. 3A is an exploded perspective view of an assembly including an interconnect circuit having an electro-thermal conductor with one electrical conductor portion, in accordance with some embodiments.
Figure 3B:
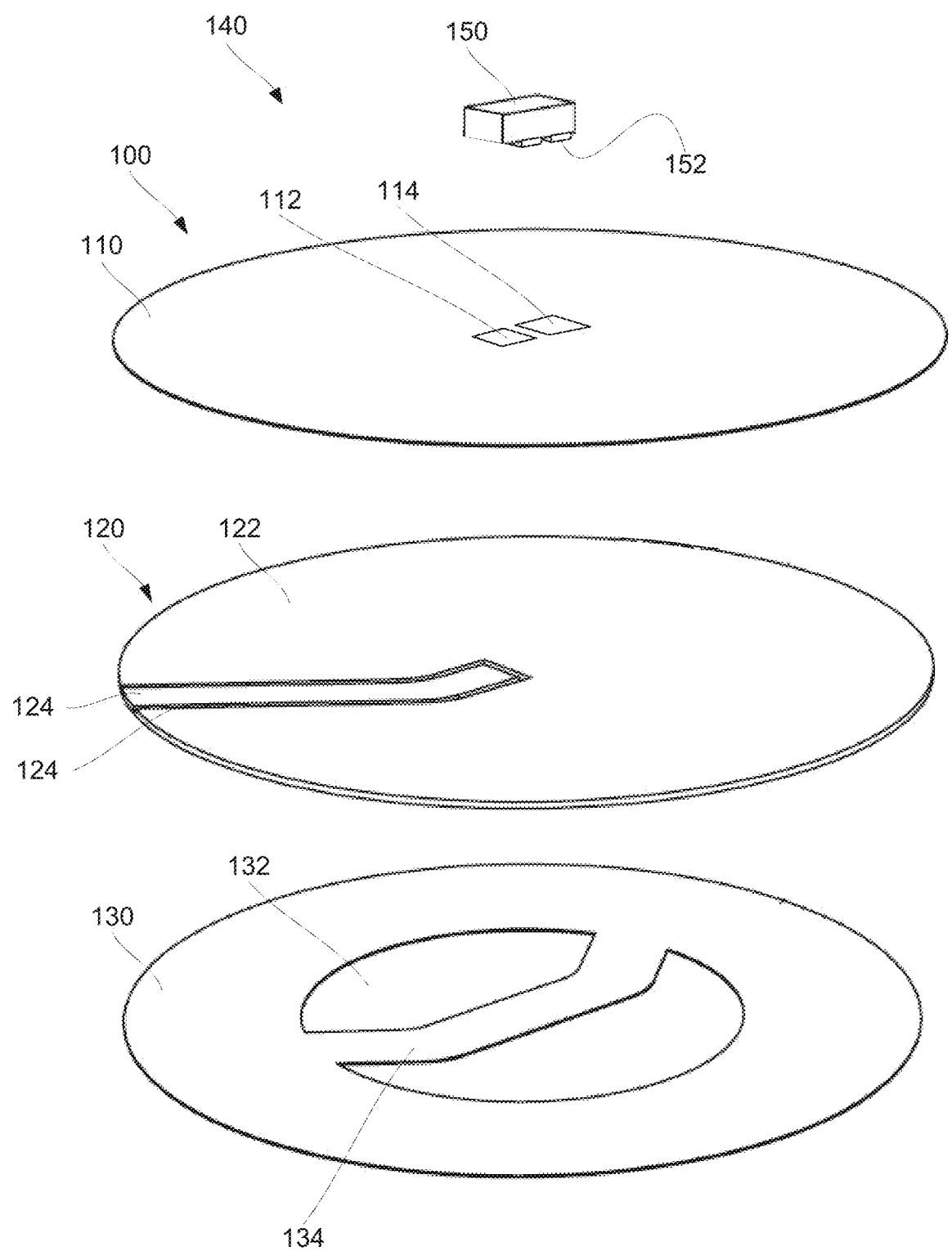
FIG. 3B is an exploded perspective view of an assembly including an interconnect circuit connected to a different type of device, in accordance with some embodiments.

In alternative embodiments, electro-thermal conductor 120 includes only two components, i.e., thermal conductor portion 122 and one electrical conductor portion (e.g., first electrical conductor portion 124) as, for example, shown in FIGS. 3A and 3B.

In some embodiments, e.g., when device 150 is an LED or another light emitting device, device-side 121a surface of electro-thermal conductor 120 and/or of first insulator 110 may have a high diffuse reflectance. This feature assists with the distribution of light from the LED. For example, the total reflectance of device-side 121a surface of electro-thermal conductor 120 and/or of first insulator 110 may be greater than around 50%, and the diffuse reflectance of electro-thermal conductor 120 and/or of first insulator 110 may be greater than around 25%.

Insulator Examples

In some embodiments, first insulator 110 is adhered to at least a portion of electro-thermal conductor 120 or, more specifically, to a portion of device-side surface 121a. In these embodiments, first insulator 110 maintains registration between different portions of electro-thermal conductor 120, such as between thermal conductor portion 122 and first electrical conductor portion 124. Specifically, first insulator 110 may keep thermal conductor portion 122 electrically isolated from first electrical conductor portion 124 by, for example, maintaining gap 128 between these two portions.

First insulator 110 may comprise one or more openings, such as first opening 112 and second opening 114. These openings may be used for forming electrical and/or thermal connections between electro-thermal conductor 120 and device 150. In the same or other examples, the openings may be used to dissipate heat from device 150 to electro-thermal conductor 120. In some embodiments, one opening may be used to form multiple independent electrical connections, which may be electrically isolated from each other (e.g., with an air gap).

When first insulator 110 has multiple openings, first opening 112 may not be connected to second opening 114 as, for example, shown in FIG. 2A. This separation between first opening 112 and second opening 114 may be used to prevent electrical shorts between electrical connections formed through different openings. For example, a conductive material, such as a conductive adhesive or a solder, may be used for making electrical connections through the openings such that the openings may be partially or fully filled with the conductive material. The separation between the openings prevents this material from flowing between the openings and causing an electrical short. In some embodiments, the minimum separation distance between the openings is at least about 0.2 millimeters or, more specifically, at least about 0.5 millimeters.

In some embodiments, e.g., when second electrical conductor portion 126 is present, first insulator 110 may comprise third opening 116. This third opening 116 may overlap with second electrical conductor portion 126. Third opening 116 may be aligned with end 126' of second electrical conductor portion 126 as, for example, shown in FIG. 2D. In a similar manner, second opening 114 may be aligned with end 124' of first electrical conductor portion 124.

Some examples of materials of first insulator 110 include, but not limited to, polyimide (PI), polyethylene naphthalate (PEN), polyethylene terephthalate (PET), polymethyl methacrylate (PMMA), ethyl vinyl acetate (EVA), polyethylene (PE), polypropylene (PP), polyvinyl fluoride (PVF), polyamide (PA), soldermask, or polyvinyl butyral (PVB). The composition and thickness of first insulator 110 may be chosen to maximize heat dissipation through first insulator 110, prevent dielectric breakdown to the surrounding environment, act as a sufficient mechanical barrier to air and moisture, and minimize distortion of the openings in first insulator 110 and features of electro-thermal conductor 120 described elsewhere.

Figure 4A:
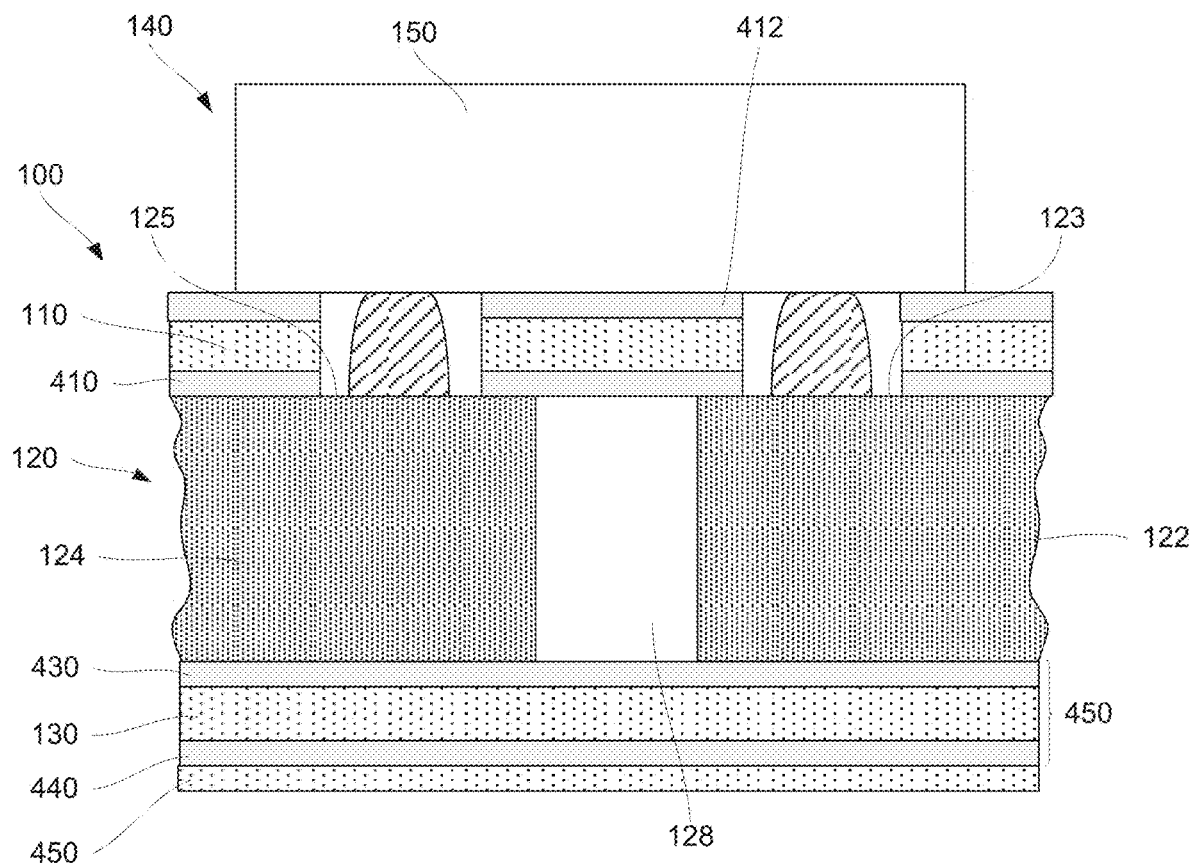
FIG. 4A is a schematic cross-sectional view of an assembly including an interconnect circuit having an electro-thermal conductor disposed between two insulators with an unfilled gap between portions of the electro-thermal conductor, in accordance with some embodiments.
Figure 4B:
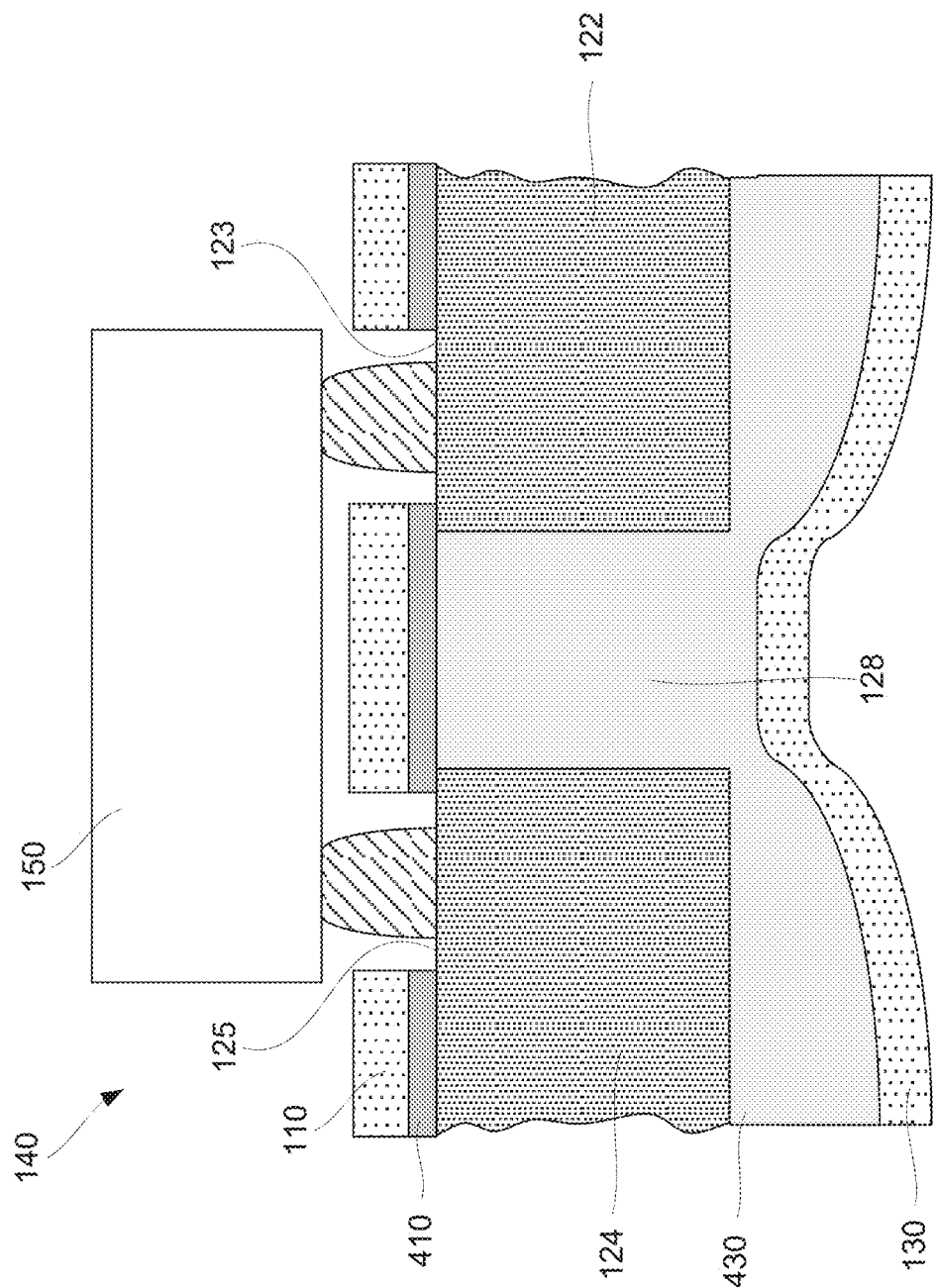
FIG. 4B is a schematic cross-sectional view of a different assembly including an interconnect circuit having an electro-thermal conductor disposed between two insulators with a filled gap between portions of the electro-thermal conductor, in accordance with some embodiments.

The thickness of first insulator 110 may be between 1 micrometer and 500 micrometers or, more specifically, between 10 micrometers and 125 micrometers. In some embodiments, first insulator 110 includes an adhesive layer on its own device-side, which is the side opposite to electro-thermal conductor 120. Adhesive layer 412 is shown in FIG. 4A and may be used for adhering device 150 to interconnect circuit 100.

In some embodiments, interconnect circuit 100 further comprises second insulator 130 in addition to first insulator 110. In these embodiments, electro-thermal conductor 120 is disposed between first insulator 110 and second insulator 130 as, for example, shown in FIGS. 2A and 2D. Electro-thermal conductor 120 may be adhered to both first insulator 110 and second insulator 130.

The material composition of second insulator 130 may be the same or different as the material composition of first insulator 110. The thickness of second insulator 130 may be the same or different as the thickness of first insulator 110. For example, one of the insulators may be used as a primary structural support and may be thicker or made from a more mechanically strong material than the other insulator. Various examples of first insulator 110 are described above. These examples generally apply to second insulator 130 as well.

In some embodiments, second insulator 130 is a continuous sheet without any openings. Alternatively, second insulator 130 may comprise one or more openings, such as openings 132 and 136 shown in FIG. 2A. Openings 132 and 136 may overlap with thermal conductor portion 122. Openings 132 and 136 may be used for the removal of heat from thermal conductor portion 122 and/or accessing thermal conductor portion 122 when, for example, forming one or more connections between thermal conductor portion 122 and device 150. Specifically, device area opening 136 may be aligned with first opening 112 of first insulator 110. During processing, the back surface (the surface opposite of device 150) of thermal conductor portion 122 may be contacted to apply heat, electrical current, and/or pressure to thermal conductor portion 122 while forming one or more connections between thermal conductor portion 122 and device 150 through first opening 112 of first insulator 110. Openings 132 and/or 136 may be used for the removal of heat from thermal conductor portion 122. The size and location of these openings 132 and/or openings 136 depends on the function of thermal conductor portion 122 (e.g., if thermal conductor portion 122 is neutral, grounded, or used as a conductive trace for the device 150), the thermal conductivity of the back surface of thermal conductor portion 122, and circuit components that may contact or be in proximity of the back surface of thermal conductor portion 122.

In some embodiments, neither one of one or more openings 132 and 136 of second insulator 130 overlaps with first electrical conductor portion 124 of electro-thermal conductor 120. In other words, first electrical conductor portion 124 may be fully covered by second insulator 130. Second insulator 130 may protect first electrical conductor portion 124 from shorting at least on the back side of first electrical conductor portion 124. The device-side of first electrical conductor portion 124 may be partially protected by first insulator 110. However, first insulator 110 may have at least second opening 114 to form electrical connection to first electrical conductor portion 124 through first insulator 110.

In some embodiments, second insulator 130 comprises bridging portion 134 extending between at least two openings 132. Bridging portion 134 may overlap with both first electrical conductor portion 124 and thermal conductor portion 122 to ensure support to both first electrical conductor portion 124 and thermal conductor portion 122 with respect to each other. In other words, bridging portion 134 may be adhered to both first electrical conductor portion 124 and thermal conductor portion 122. A similar bridging portion may be used between second electrical conductor portion 126 and thermal conductor portion 122, if second electrical conductor portion 126 is used.

Adhesive Examples

In some embodiments, first insulator 110 is adhered to electro-thermal conductor 120 or, more specifically, to device-side 121a of electro-thermal conductor 120 using first adhesive 410. If present, second insulator 130 may be adhered to electro-thermal conductor 120 or, more specifically, to back-side 121b of electro-thermal conductor 120 using second adhesive 430 as, for example, shown in FIG. 4A. First adhesive 410 may be the same as second adhesive 430. Alternatively, first adhesive 410 may be different from second adhesive 430. For example, the melt flow index of first adhesive 410 may be about 6 dg/min or less (as defined by ASTM D1238, 2.16 kg, 190 C), whereas the melt flow index of second adhesive 430 may be about 10 dg/min or more. In this example, second adhesive 430 will flow more readily than first adhesive 410 during thermal lamination of interconnect circuit 100. Second adhesive 430 may fill gap 128 between conductor portions as, for example, shown in FIG. 4B. First adhesive 410 may remain substantially between first insulator 110 and electro-thermal conductor 120 without bleeding significantly into first contact portion 125 and second contact portion 123. In some embodiments, a portion of first adhesive 410 is also present over gap 128 if gap 128 is covered with first insulator 110 as, for example, is shown in FIG. 4A. Alternatively, both first adhesive 410 and second adhesive 430 may fill gaps 128, but the volume of first adhesive 410 in gaps 128 may be less than volume of second adhesive 430. Furthermore, gaps 128 may remain substantially empty even though first adhesive 410 and/or second adhesive 430 overlap with gaps 128.

Some examples of first adhesive 410 and second adhesive 430 include, but are not limited to polyolefin adhesives, polyester adhesives, polyimide adhesives, acrylics, epoxies, cross-linking adhesives, PSAs, and/or thermoplastic adhesives. Optionally, first adhesive 410 and second adhesive 430 may be filled with thermally conductive, electrically insulating particles (e.g. alumina) to facilitate heat transfer through the adhesive material. The material composition of first adhesive 410 may depend on whether any electrical connections are formed through first insulator 110. For a device-side solder pad opening in first insulator 110, and assuming a typical small-area (e.g., 3 mm×3 mm) LED, the bleed out of first adhesive 410 from the edge may be less than 200 micrometers or, more specifically, less than 100 micrometers. By contrast, for a back-side insulator opening, the bleed out of second adhesive 430 may be as high as 1 millimeter without causing difficulty.

Figure 4C:
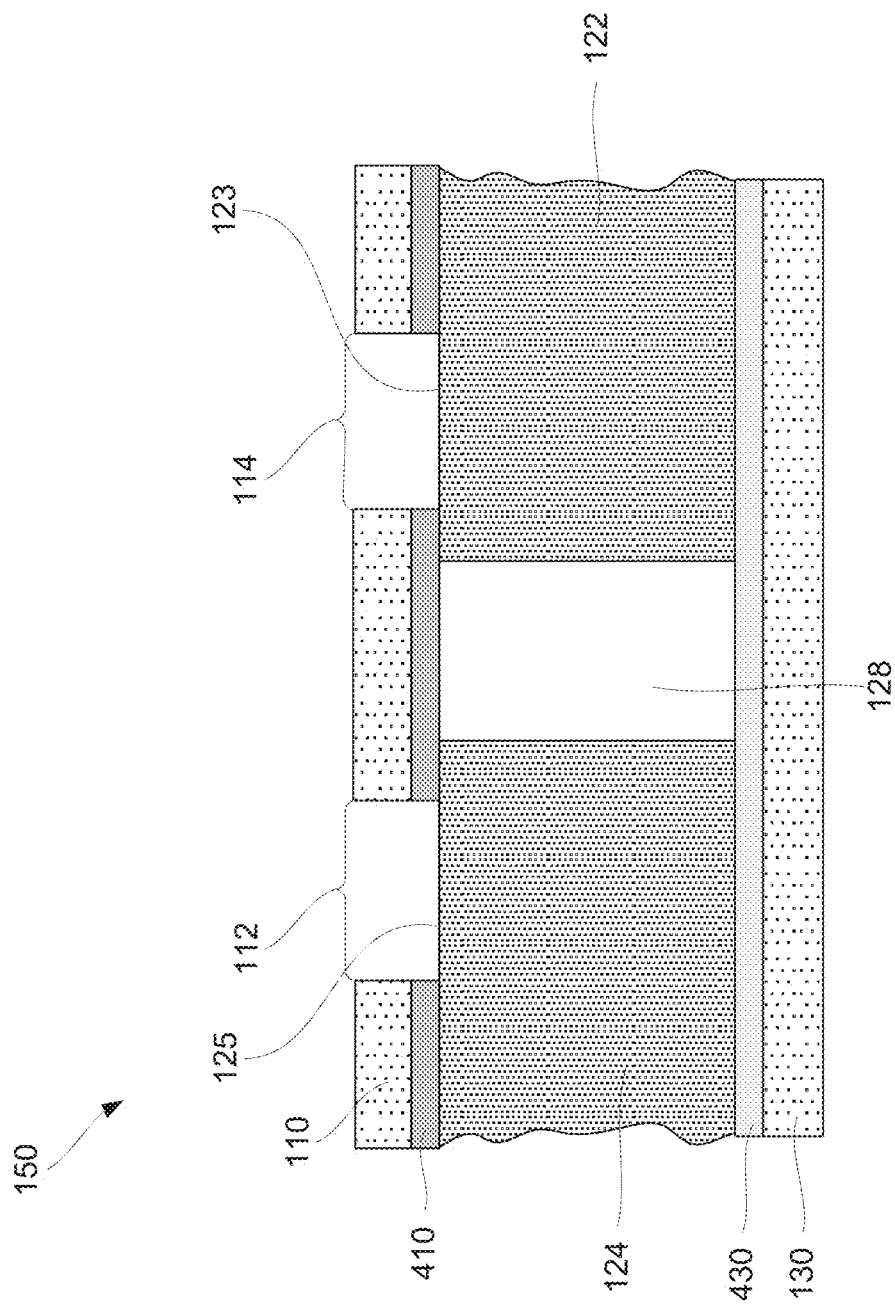
FIG. 4C is a schematic cross-sectional view of an interconnect circuit prior to forming any connections to a device, in accordance with some embodiments.

Prior to attaching interconnect circuit 100 to device 150, the surface region of first electrical conductor portion 124 of electro-thermal conductor 120 that is aligned with first opening 112 of first insulator 110 is exposed as, for example, shown in FIG. 4C. This surface may be referred to as first contact portion 125. Likewise, the surface region of thermal conductor portion 122 of electro-thermal conductor 120 that is aligned with second opening 114 of first insulator 110 may be exposed and may be referred to as a second contact portion 123. These surfaces may be substantially free from any adhesives (other than slight adhesive bleed-out near the edges of first opening 112 and second opening 114 in first insulator 110) and may be used to form connections between electro-thermal conductor 120 and device 150.

Figure 4D:
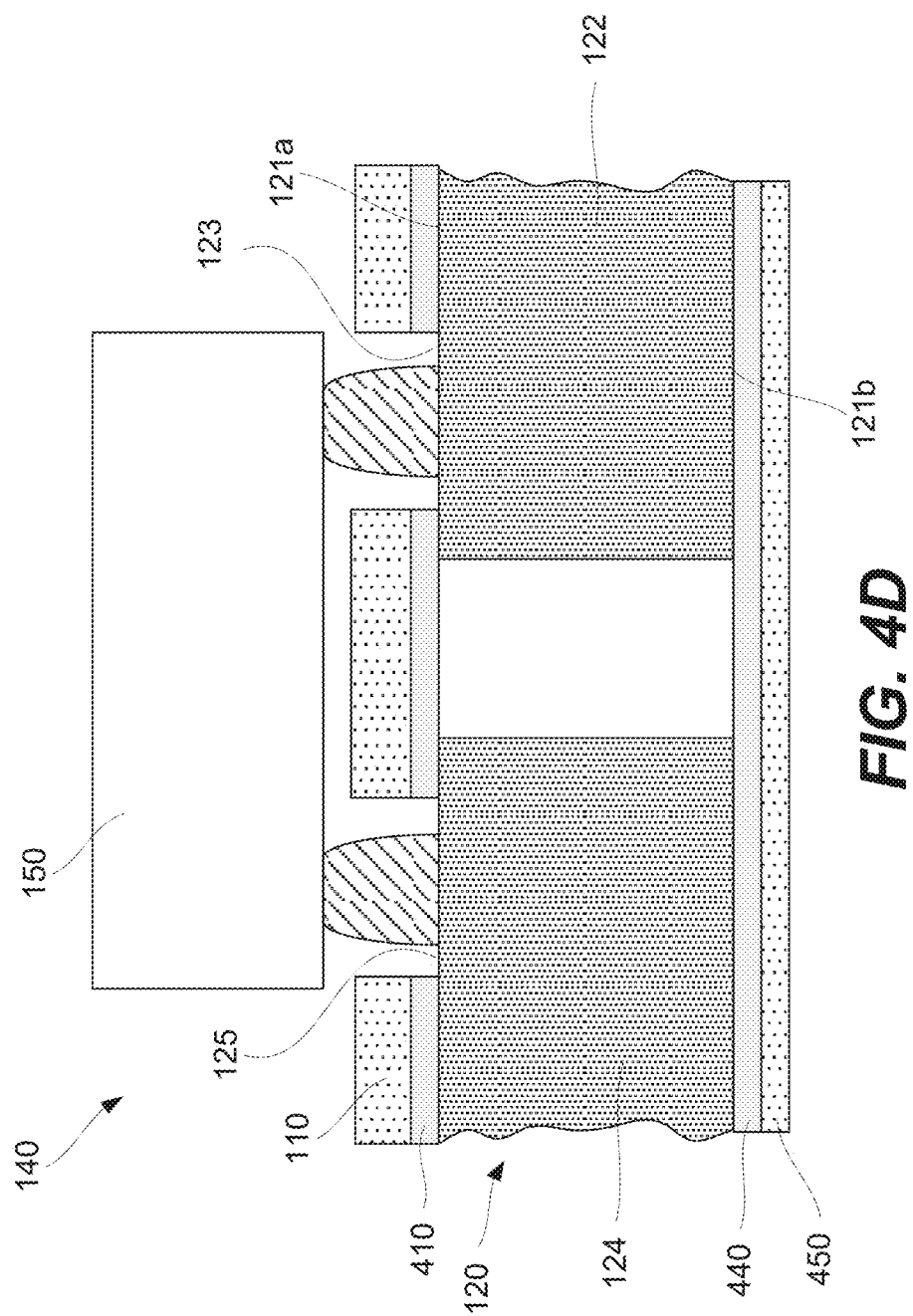
FIG. 4D is a schematic cross-sectional view of an interconnect circuit showing a removable film protecting a mounting adhesive layer on the side of the circuit opposite of the device, in accordance with some embodiments.
Figure 4E:
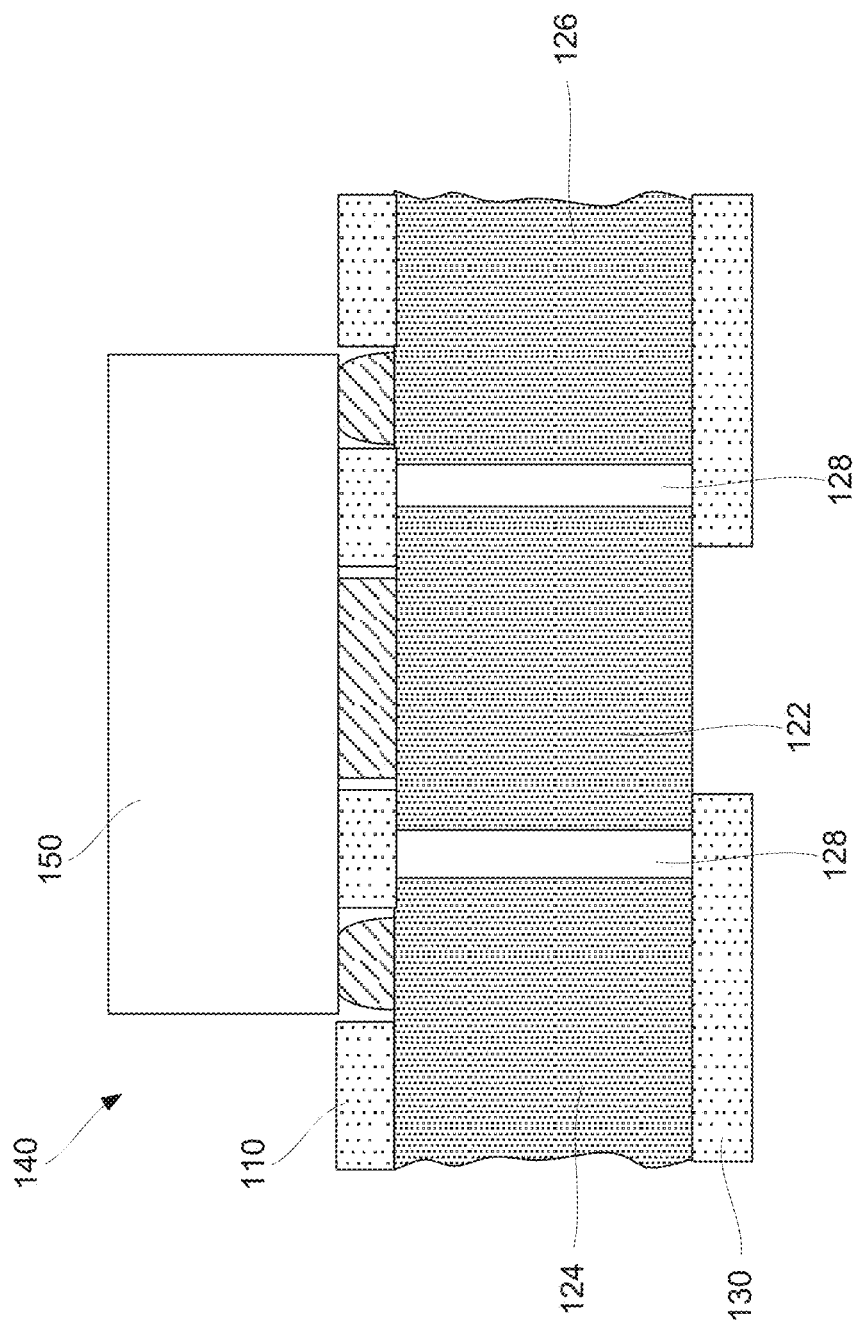
FIG. 4E is a schematic cross-sectional view of an assembly including the interconnect circuit and the device of FIG. 2A, in accordance with some embodiments.

In some embodiments, an additional adhesive layer 440 may be disposed on a surface of second insulator 130 opposite of electro-thermal conductor 120. This additional adhesive layer 440 may be used for adhering interconnect circuit 100 to a supporting structure during installation of interconnect circuit 100 (as, e.g., shown in FIG. 1E and described above) and may be referred to as a mounting adhesive. In other words, second insulator 130 may be disposed between two adhesive layers 430 and 440. In some embodiments, second insulator 130 and two adhesive layers 430 and 440 are provided as a single component such as a thermal PSA tape, for example. As with first adhesive 410 and second adhesive 430, additional adhesive layer 440 may be filled with thermally conductive but electrically insulating particles to facilitate heat transfer to adjacent layers. Alternatively, mounting adhesive 440 may be disposed directly on back-side 121b of electro-thermal conductor 120 and second insulator 130 may be absent, as for example, shown in FIG. 4D. Prior to installation of interconnect circuit 100, mounting adhesive layer 440 may be covered with removable film 450 (e.g., releasable liner) to protect mounting adhesive layer 445 and preserve its adhesive properties.

Examples of Sublayers of Electro-Thermal Conductors

Figure 10A:
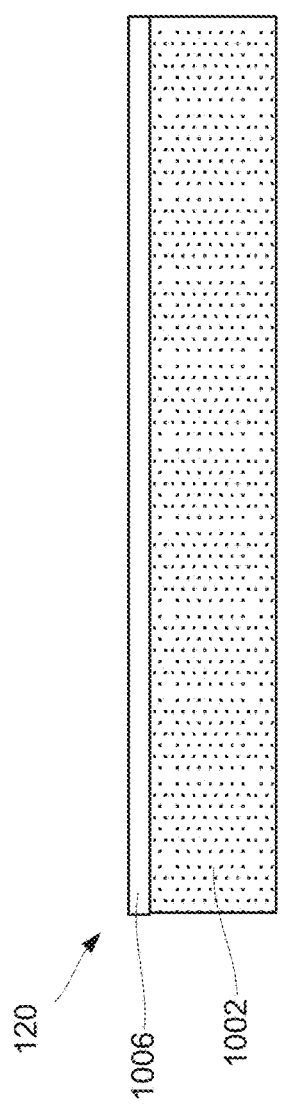
FIGS. 10A-10C are schematic cross-sectional views of different examples of an electro-thermal conductor, in accordance with some embodiments.

In some embodiments, electro-thermal conductor 120 comprises base sublayer 1002 and surface sublayer 1006 as, is shown in FIG. 10A, for example. Surface sublayer 1006 may have a different composition than base sublayer 1002. First insulator 110 may be laminated over surface sublayer 1006 as is shown in FIGS. 11A and 11C, for example. More specifically, at least a portion of surface sublayer 1006 may directly interface first insulator 110 or an adhesive used for attaching first insulator 110 to electro-thermal conductor 120. This approach is contrary to another example, which is common with patterned plating of surface layers 1006 shown in FIG. 11B.

In these examples, surface sublayer 1006 is disposed between base sublayer 1002 and first insulator 110. Surface sublayer 1006 may be specifically selected to improve adhesion of first insulator 110 to electro-thermal conductor 120, and/or other purposes as described below.

Base sublayer 1002 may comprise a metal selected from the group consisting of aluminum, titanium, nickel, copper, steel, and alloys comprising these metals. The material of base sublayer 1002 may be selected to achieve desired electrical and thermal conductivities of overall electro-thermal conductor 120 while maintaining minimal cost.

Surface sublayer 1006 may comprise a metal selected from the group consisting of tin, lead, zinc, nickel, silver, palladium, platinum, gold, indium, tungsten, molybdenum, chrome, copper, alloys thereof, organic solderability preservative (OSP), or other electrically conductive materials. The material of surface sublayer 1006 may be selected to protect base sublayer 1002 from oxidation, improve surface conductivity when forming electrical and/or thermal contact to device, improve adhesion to electro-thermal conductor 120, and/or other purposes. Furthermore, in some embodiments the addition of a coating of OSP on top of surface sublayer 1006 may help prevent surface sublayer 1006 itself from oxidizing over time.

For example, aluminum may be used for base sublayer 1002. While aluminum has a good thermal and electrical conductivity, it forms a surface oxide when exposed to air. Aluminum oxide has poor electrical conductivity and may not be desirable at the interface between electro-thermal conductor 120 and device 150. In addition, in the absence of a suitable surface sublayer, achieving good, uniform adhesion between the surface oxide of aluminum and many adhesive layers may be challenging. Therefore, coating aluminum with one of tin, lead, zinc, nickel, silver, palladium, platinum, gold, indium, tungsten, molybdenum, chrome, or copper before aluminum oxide is formed mitigates this problem and allows using aluminum as base sublayer 1002 without compromising electrical conductivity or adhesion between electro-thermal conductor 120 and the other layers of the interconnect circuit 100.

Surface sublayer 1006 may have a thickness of between about 0.01 micrometers and 10 micrometers or, more specifically, between about 0.1 micrometers and 1 micrometer.

For comparison, thickness of base sublayer 1002 may be between about 10 micrometers and 1000 micrometers or, more specifically, between about 100 micrometers and 500 micrometers. As such, base sublayer 1002 may represent at least about 90% or, more specifically, at least about 95% or even at least about 99% of electro-thermal conductor 120 by volume.

While some of surface sublayer 1006 may be laminated to first insulator 110, a portion of surface sublayer 1006 may remain exposed. This portion may be used to form electrical and/or thermal contacts between electro-thermal conductor 120 and device 150.

In some embodiments, electro-thermal conductor 120 further comprises one or more intermediate sublayers 1004 disposed between base sublayer 1002 and surface sublayer 1006. Intermediate sublayer 1004 has a different composition than base sublayer 1002 and surface sublayer 1006. In some embodiments, the one or more intermediate sublayers 1004 may help prevent intermetallic formation between base sublayer 1002 and surface sublayer 1006. For example, intermediate sublayer 1004 may comprise a metal selected from group consisting of chromium, titanium, nickel, vanadium, zinc, and copper.

In some embodiments, electro-thermal conductor 120 may comprise rolled metal foil. In contrast to the vertical grain structure associated with electrodeposited foil and/or plated metal, the horizontally-elongated grain structure of rolled metal foil may help increase the resistance to crack propagation in electro-thermal conductor 120 under cyclical loading conditions. This may help increase the fatigue life of interconnect circuit 100.

Figure 10B:
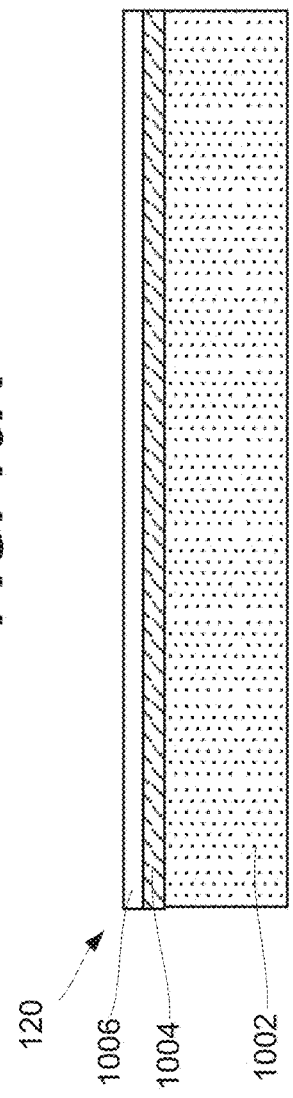
Figure 10C:
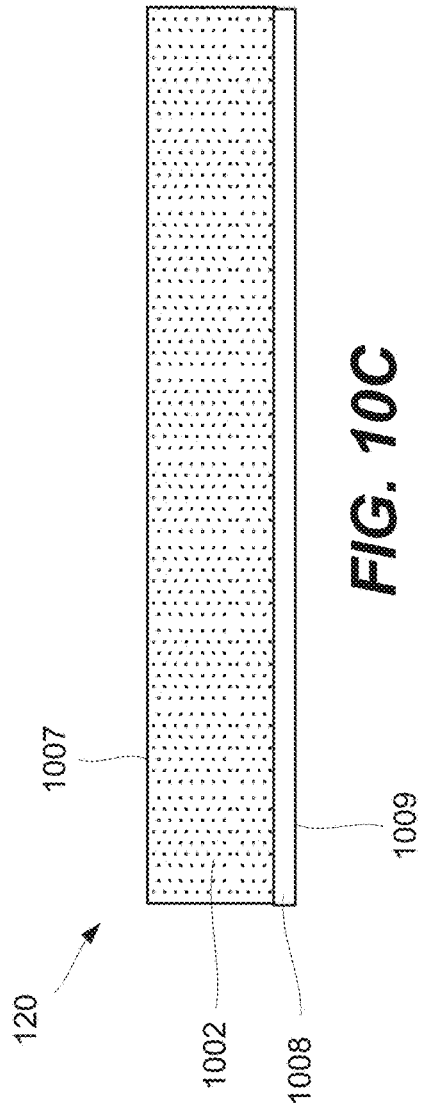

In some embodiments, electro-thermal conductor 120 comprises electrically insulating coating 1008 forming surface 1009 of electro-thermal conductor 120 opposite of device-side surface 1007 as, for example, shown in FIG. 10C. At least a portion of this surface 1009 may remain exposed in interconnect circuit 100 and may be used for heat removal from interconnect circuit 100. In some embodiments, entire surface 1009 remains exposed in interconnect circuit 100. Insulating coating 1008 may be selected for relatively high thermal conductivity and relatively high electrical resistivity and may comprise a material selected from group consisting of silicon dioxide, silicon nitride, anodized alumina, aluminum oxide, boron nitride, aluminum nitride, diamond, and silicon carbide. Alternatively, insulating coating may comprise a composite material such as a polymer matrix loaded with thermally conductive, electrically insulating inorganic particles.

In some embodiments, electro-thermal conductor 120 is solderable. When electro-thermal conductor 120 includes aluminum, the aluminum may be positioned as the base sublayer, while the surface sublayer may be made from a material having a melting temperature that is above the melting temperature of the solder. Otherwise, if the surface sublayer melts during circuit bonding, oxygen may penetrate through the surface sublayer and oxidize aluminum within the base sublayer. This in turn may reduce the conductivity at the interface of the two sublayers and potentially cause a loss of mechanical adhesion. Hence for many solders which are applied at temperatures ranging from 150-300 C, a surface sublayer may be formed from zinc, silver, palladium, platinum, copper, nickel, chrome, tungsten, molybdenum, or gold.

Examples of Methods of Forming Interconnect Circuits

Conventional techniques of fabricating electrically-conductive traces, such as electroplating or etching, are not easily scaled for fabrication of thicker conductive structures, such as structures having thicknesses of at least about 100 micrometers. Specifically, etching of thick conductive layers frequently results in undercuts beneath mask layers, which can lead to poorly-defined traces in final circuits. Furthermore, mask-and-etch techniques are generally not well-suited to the fabrication of large-area interconnect circuits used to make various one-dimensional and two-dimensional interconnected arrays because of excessive chemical etch waste and inconsistencies in etching parameters across large surfaces.

Another difficulty with conventional methods involve forming insulator openings. For example, forming openings in a back-side insulator may be beneficial from thermal management perspective, e.g., to dissipate the heat through the opening rather than through the insulator. However, problems associated with forming such "back-bared" circuits arise from a process step in which a pre-patterned back-side insulator is laminated in registration to a masked (but un-etched) conductive layer. Because the conductive layer is un-etched, there is no line of sight available between the layers to ensure the proper alignment. In addition, it may be difficult to prevent the unintentional removal of the back-bared metal region during etching. These issues can result in a low manufacturing yield and increased manufacturing costs for this type of circuit.

Figure 5:
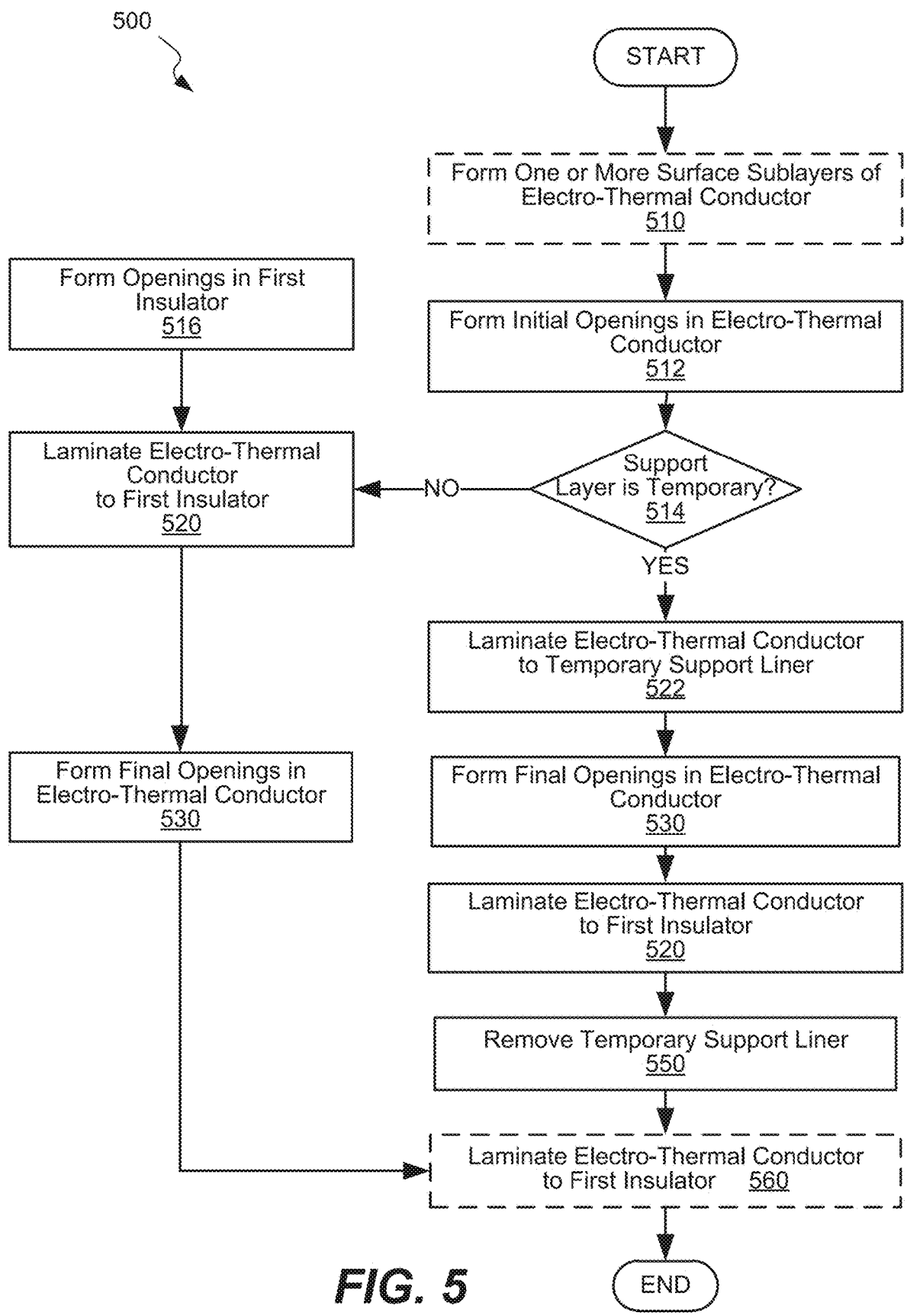
FIG. 5 is a process flowchart corresponding to a method of forming an interconnect circuit, in accordance with some embodiments.

To overcome these challenges, various examples of fabrication methods that do not involve mask-and-etch techniques are described herein. Specifically, FIG. 5 is a process flowchart corresponding to method 500 of forming an interconnect circuit described above. FIGS. 6A-7C show interconnect circuit 100 and its components at various stages of this method.

Method 500 may commence with forming an electro-thermal conductor or, more specifically, with forming one or more surface sublayers on one or both sides of the conductor during optional operation 510. This operation may be performed prior to laminating the electro-thermal conductor to an insulator layer or to a temporary support liner as further described below. Furthermore, this forming operation may be performed prior to forming openings in the conductor. In some embodiments, the electro-thermal conductor may be formed in a different process and supplied to method 500 in a ready-to-use form. Examples of the electro-thermal conductor formed during operation 510 (or supplied as such) are shown in FIGS. 10A-10C and described above.

Returning to FIG. 5, method 500 may proceed with forming one or more initial openings in the electro-thermal conductor during operation 512. These openings may at least partially define different portions of the electro-thermal conductor and may be referred to as partially formed gaps. These openings may be formed using various techniques including, but not limited to, punching, flat bed die cutting, match-metal die cutting, male/female die cutting, rotary die cutting, steel rule die cutting, laser cutting, water-jet cutting, machining, or combinations thereof. In some embodiments, rotary die cutting may be used to form these sets of openings. Each set of openings may partially define a region (e.g., a contact pad or trace for electrically coupling to a device) of the electro-thermal conductor.

A challenge associated with traditional mask-and-etch-based flexible circuit fabrication methods is the difficulty in patterning circuit traces at a smaller linewidth than four to five times the thickness of the conductive foil. In some embodiments, the non-chemical-etch-based patterning methods described above may be used to precisely define the width of the gaps independent of the thickness of the electro-thermal conductor. As such, very small precise gaps may be formed in the electro-thermal conductor such that the maximum footprint of the electro-thermal conductor may be used for electrical and thermal conductance.

The use of non-chemical-etch-based patterning to achieve precise control of these opening (and later the width of the gaps) may result in better control over the registration of different portions than traditional means of fabrication. The patterning may be achieved by either through-cutting the electro-thermal conductor before it has been attached to an insulating layer, or, in the case of laser processing or machining, by ablating or milling away the electro-thermal conductor from an insulating layer after the attachment has occurred.

Figure 6A:
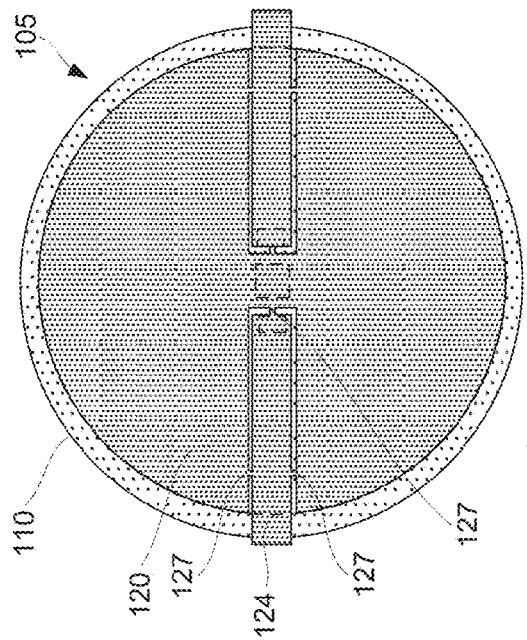

After completing operation 512, one or more connecting tabs 127 may extend across the gaps as, for example, shown in FIG. 6A. Connecting tabs 127 may remain in place at this processing stage to mechanically support and maintain registration of different portions of the electro-thermal conductor relative to each other. At this stage, these different portions may not be supported by any other components, such as insulators or temporary support liners. Referring to FIG. 6A illustrating an example of electro-thermal conductor 120 prior to it being laminated to any support layers, three connecting tabs 127 extend between thermal conductor portion 122 and first electrical conductor portion 124 and three additional connecting tabs 127 extend between thermal conductor portion 122 and second electrical conductor portion 126. The number and size of these connecting tabs 127 is determined based on the size, flexibility, support needed, and other factors associated with the electro-thermal conductor. For example, connecting tabs 127 may be evenly distributed around each portion to provide uniform support.

Method 500 may also involve forming openings in one or more insulators (e.g., forming openings in a first insulator) during operation 516. These openings may be formed using various techniques including, but not limited to, punching, flat bed die cutting, match-metal die cutting, male/female die cutting, rotary die cutting, steel rule die cutting, laser cutting, water-jet cutting, machining, or combinations thereof. Furthermore, the openings in the insulator and the openings in the electro-thermal conductor may be used for registration of the insulator relative to the electro-thermal conductor during lamination.

Figure 6C:
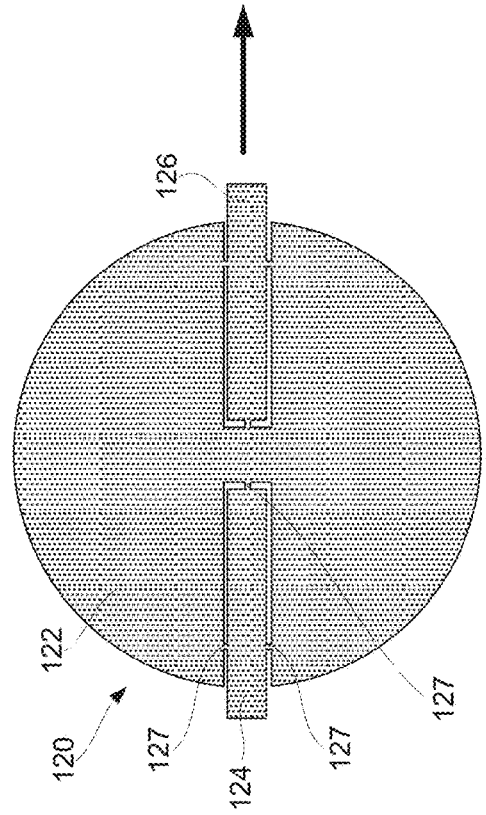
Figure 6B:
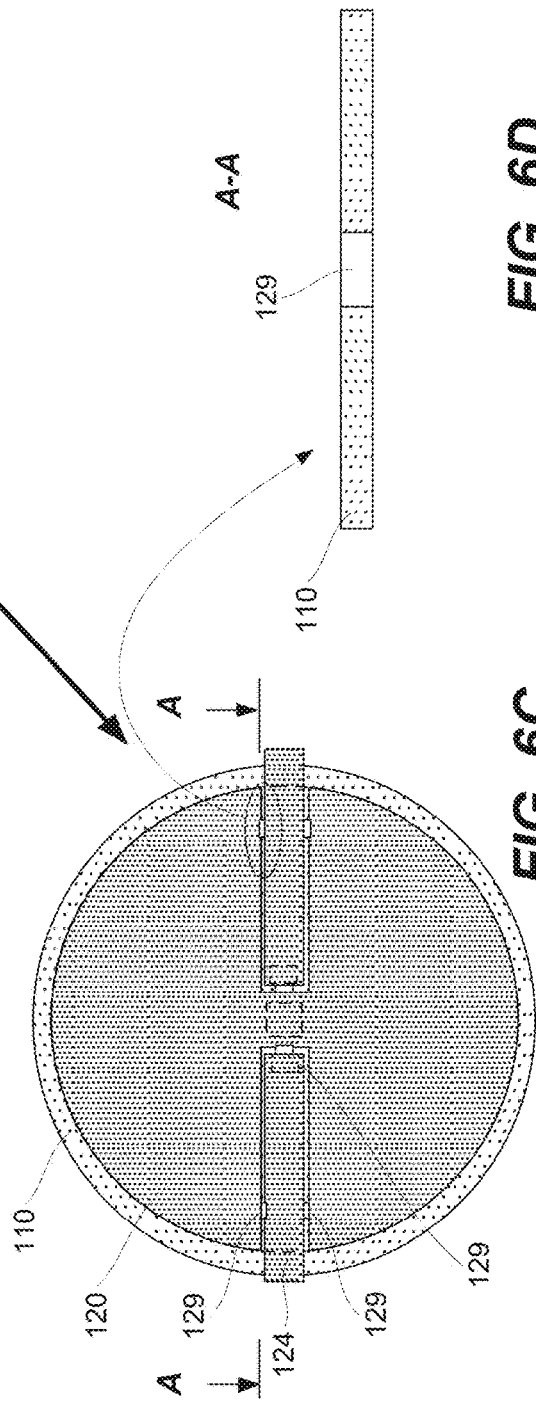

In order to remove connecting tabs 127, different portions of the electro-thermal conductor may need to first be supported and be able to maintain registration with respect to each other. This may be achieved by attaching a support layer to the electro-thermal conductor. The support layer may be either a first insulator or a temporary support liner as shown by decision block 514 in FIG. 5. When the support layer is the first insulator, method 500 may proceed with laminating the electro-thermal conductor to the first insulator during operation 520. FIG. 6B is a schematic illustration of electro-thermal conductor 120 laminated to first insulator 110 with connecting tabs 127 still being a part of electro-thermal conductor 120. However, after this lamination operation, first electrical conductor portion 124, second electrical conductor portion 126, and thermal conductor portion 122 are also supported with respect to each other by first insulator 110 and connecting tabs 127 are no longer needed and can be removed in a subsequent operation.

If the first layer used during operation 520 has any patterned features, then just prior to lamination, these features may be aligned with the openings previously formed in the electro-thermal conductor. In this example, the alignment of the patterned insulator to a partially-patterned electro-thermal conductor may be performed using openings in each of the layers as aligning features. Compared to conventional techniques for producing a back-bared flexible circuit, the availability of patterned features on the same side of both the electro-thermal conductor and insulating layer may help simplify process the aligning of the layers, thereby improving yield and reducing cost.

In some embodiments, while laminating electro-thermal conductor 120 to one or both of first insulator 110 and second insulator 130, gap 128 (or at least partially formed gap 128) between thermal conductor portion 122 and first electrical conductor portion 124 of electro-thermal conductor 120 may be filled with an adhesive. The adhesive filling the gap may be the same as the adhesive used for laminating first insulator 110 to electro-thermal conductor 120. Alternatively, the adhesive filling the gap may be different from the adhesive used for laminating first insulator 110 to electro-thermal conductor 120. For example, the adhesive filling the gap when second insulator 130 is applied may have a much higher melt flow index than the adhesive used for laminating first insulator 110 to electro-thermal conductor 120.

Figure 6D:
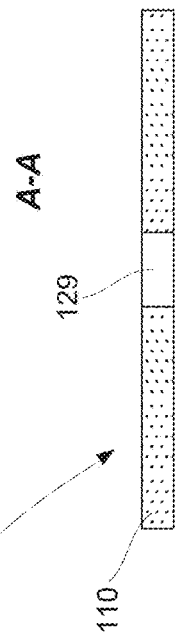

Method 500 may proceed with forming final openings in the electro-thermal conductor during operation 530. If the electro-thermal conductor has already been laminated to the first insulator during this operation, these additional openings may be formed through the first insulator as well as, for example, schematically shown in FIGS. 6C and 6D. Specifically, FIG. 6C is a top schematic view of an assembly including first insulator 110 and electro-thermal conductor 120 with additional openings 129 formed in the place of former connecting tabs. As such, forming these additional openings 129 removes the connecting tabs but may also form openings 129 in first insulator 110 when, a die cutting or another similar technique is used to form openings 129. FIG. 6D is a cross-sectional schematic view of first insulator 110 showing openings 129 in first insulator 110. It should be noted that because of the small size of openings 129 (roughly defined by the size of the former connecting tabs), these openings do not interfere with performance of first insulator 110 (e.g., supporting different portions of electro-thermal conductor 120, electrically isolating portions of electro-thermal conductor 120).

When the support layer is a temporary support liner (rather than one of the insulator), method 500 may proceed with laminating the electro-thermal conductor to the temporary support liner during operation 522. FIG. 7A illustrates an assembly having electro-thermal conductor 120 laminated to temporary support liner 700 with connecting tabs 127 still being a part of electro-thermal conductor 120. Temporary support liner 700 may not have any openings or need any particular registration with respect to electro-thermal conductor 120 (unlike the insulator layer). After this lamination operation, first electrical conductor portion 124, second electrical conductor portion 126, and thermal conductor portion 122 are also supported with respect to each other by temporary support liner 700 and connecting tabs 127 are no longer needed.

Materials that may be suitable for the temporary support liner include, but are not limited to, polyimide (PI), polyethylene naphthalate (PEN), polyethylene terephthalate (PET), polymethyl methacrylate (PMMA), ethyl vinyl acetate (EVA), polyvinyl butyral (PVB), polyethylene (PE), polypropylene (PP), polyolefin, paper, or conductive foil. Furthermore, the temporary support liner may include a low-tack adhesive coating such as a PSA on its surface to facilitate bonding to the conductive foil. Alternatively, if the temporary support liner does not include an adhesive coating, an adhesive material such as a thermoplastic sheet or wet-coatable PSA may be incorporated in between the electro-thermal conductor and temporary support liner just prior to lamination. The temporary support liner and its coatings may maintain a low-tack adhesive bond to electro-thermal conductor through some operations including forming final openings (gaps) and laminating electro-thermal conductor to the insulator. This feature ensures mechanical support to different portions of the electro-thermal conductor while, at the same time, allowing the temporary support liner to be removed when this support is later provided by the insulating layer.

As noted above, the temporary support liner layer may be used for registering the patterned insulator to the patterned electro-thermal conductor when the insulator is later laminated to the conductor. For example, in a roll-to-roll-based manufacturing process, a roll of the partially-patterned electro-thermal conductor may be additionally patterned with the temporary support liner laminated to it to provide mechanical support to various portions of the electro-thermal conductor components formed during patterning. This patterning process may be followed by the singulation of the rolls of the laminate including the electro-thermal conductor and releasable layer into individual parts including the patterned electro-thermal conductor and releasable layer. For example, the individual parts may correspond to a single interconnect circuit or to 2-100 interconnect circuits. Similarly, rolls of the insulating layer may also be patterned in-line and then singulated into individual parts that optionally correspond to a single interconnect circuit or to 2-100 interconnect circuits. The individual parts (one part being the patterned electro-thermal conductor/releasable layer laminate and the other part being patterned insulating layer) may then be aligned with each other. For example, various flexible circuit lamination techniques, such as pin-based or optical registration, may be used for this purpose. In some embodiments, the releasable layer is not involved in the registration. In these embodiments, the releasable layer simply holds the electro-thermal conductor in place during the second cut. The registration of the second cut may be made to features put into the electro-thermal conductor during the first cut. After the alignment, the parts are laminated together and the releasable layer is removed. Comparing this process to conventional processes in which the patterned electro-thermal conductor and the patterned insulator are registered to each other as continuous rolls in-line, the process described herein may help to simplify manufacturing, improve throughput, and improve yield.

Method 500 may proceed with forming final openings in the electro-thermal conductor during operation 530. These final openings may include final gaps as described above. These final opening may involve forming additional openings to remove connecting tabs and these additional openings may be formed through the temporary support liner as, for example, schematically shown in FIGS. 7B-7C. Specifically, FIG. 7B is a top schematic view of an assembly including temporary support liner 700 and electro-thermal conductor 120 with additional openings 129 formed in place of the connecting tabs. As such, forming these additional openings 129 removes these connecting tabs but also forms openings 129 in temporary support liner 700. In this case, method 500 may proceed with laminating the first insulator to the electro-thermal conductor during operation 520. The first insulator may be laminated to an exposed surface of the electro-thermal conductor (i.e., a surface that is opposite the surface to which the temporary release liner has been applied). At this stage, the first insulator provides support to different portions of the electro-thermal conductor, and method 500 proceeds with removing the temporary support liner during operation 550. Because the connecting tabs were removed prior to laminating the first insulator, the first insulator does not have corresponding openings. FIG. 7C is a top schematic view of an assembly including first insulator 110 and electro-thermal conductor 120 with continuous openings in electro-thermal conductor 120.

In some embodiments, a second insulator may be laminated to the electro-thermal conductor during optional operation 560. The second insulator may be laminated to an exposed surface of the electro-thermal conductor (i.e., a surface that is opposite the surface to which the first insulator has been applied).

What is claimed is:

1. An interconnect circuit comprising:
  an electro-thermal conductor, comprising a thermal conductor portion and an electrical conductor portion,
    wherein the thermal conductor portion is electrically isolated from the electrical conductor portion with a gap,
    wherein each of the thermal conductor portion and the electrical conductor portion comprises a base sublayer and a surface sublayer having a different composition than the base sublayer, and
    wherein the thermal conductor portion and the electrical conductor portion have an identical thickness;
  a first adhesive layer, directly interfacing the electro-thermal conductor;
  a first insulator, adhered to the electrical conductor portion using the first adhesive layer,
    wherein the first insulator supports the thermal conductor portion and the electrical conductor portion relative to each other thereby maintaining electrical isolation between the thermal conductor portion and the electrical conductor portion; and
  a second adhesive layer, directly interfacing the electro-thermal conductor such that the electro-thermal conductor is disposed between the second adhesive layer and the first adhesive layer,
    wherein the first adhesive layer and the second adhesive layer extend into the gap thereby filling the gap.

2. The interconnect circuit of claim 1, wherein the second adhesive layer is a pressure-sensitive adhesive (PSA) film.

3. The interconnect circuit of claim 1, further comprising a second insulator, directly interfacing the second adhesive layer such that the second adhesive layer is disposed between the electro-thermal conductor and the second insulator.

4. The interconnect circuit of claim 3, wherein the second insulator is a polyethylene terephthalate (PET) film.

5. The interconnect circuit of claim 4, wherein a material of the second insulator is different from a material of the first insulator.

6. The interconnect circuit of claim 3, further comprising an additional adhesive layer, directly interfacing the second insulator such that the second insulator is disposed between the additional adhesive layer and the second adhesive layer.

7. The interconnect circuit of claim 6, wherein the additional adhesive layer is a pressure-sensitive adhesive (PSA) film.

8. The interconnect circuit of claim 6, further comprising a releasable liner directly interfacing the additional adhesive layer such that the additional adhesive layer is disposed between the second insulator and the releasable liner.

9. The interconnect circuit of claim 8, wherein the releasable liner is a foil.

10. The interconnect circuit of claim 1, wherein the second insulator is a polyethylene terephthalate (PET) film.

11. The interconnect circuit of claim 1, wherein the second adhesive layer comprises thermally-conductive electrically-insulating particles.

12. The interconnect circuit of claim 1, wherein the base sublayer comprises aluminum, and wherein the surface sublayer comprises copper.

13. The interconnect circuit of claim 1, wherein each of the thermal conductor portion and the electrical conductor portion comprises an intermediate sublayer disposed between the base sublayer and the surface sublayer and having a different composition than the base sublayer and the surface sublayer.

14. The interconnect circuit of claim 13, the intermediate sublayer comprises nickel, and the surface sublayer comprises copper.

15. The interconnect circuit of claim 1, wherein the first adhesive-layer is a pressure-sensitive adhesive (PSA) film.

16. The interconnect circuit of claim 1, wherein the electrical conductor portion comprises a first contact portion formed by the surface sublayer, wherein the thermal conductor portion comprises a second contact portion formed by the surface sublayer, and wherein the first contact portion and the second contact portion are exposed an opening in the first insulator.

17. The interconnect circuit of claim 16, wherein the electrical conductor portion comprises a first contact portion formed by the surface sublayer, wherein the thermal conductor portion comprises a second contact portion formed by the surface sublayer, wherein the first contact portion is exposed through a first opening, and wherein the second contact portion is exposed through a second opening, different from the first opening.

18. The interconnect circuit of claim 1, wherein the gap between the thermal conductor portion and the electrical conductor portion is fully filled.

19. The interconnect circuit of claim 1, wherein the gap between the thermal conductor portion and the electrical conductor portion is partially filled.

20. The interconnect circuit of claim 1, wherein the first insulator extends over the gap between the thermal conductor portion and the electrical conductor portion.

* * * * *